(12) United States Patent  
Sakurai et al.

(10) Patent No.: US 7,907,771 B2
(45) Date of Patent: Mar. 15, 2011

(54) PATTERN DATA PROCESSING SYSTEM, PATTERN DATA PROCESSING METHOD, AND PATTERN DATA PROCESSING PROGRAM

(75) Inventors: Mitsuo Sakurai, Kawasaki (JP); Takahisa Itoh, Kawasaki (JP); Taketoshi Omata, Kawasaki (JP); Kenji Chichii, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 865 days.

(21) Appl. No.: 11/848,289

(22) Filed: Aug. 31, 2007

(65) Prior Publication Data

US 2008/0063259 A1 Mar. 13, 2008

(30) Foreign Application Priority Data

Sep. 13, 2006 (JP) .................................. 2006-247976

(51) Int. Cl.
 *G06K 9/00* (2006.01)
(52) U.S. Cl. ........................ 382/144; 382/141; 382/151
(58) Field of Classification Search .................. 382/141, 382/144, 151
See application file for complete search history.

(56) References Cited

U.S. PATENT DOCUMENTS

| | | | | |
|---|---|---|---|---|
| 6,622,297 B2 * | 9/2003 | Uno et al. | | 716/52 |
| 6,952,818 B2 * | 10/2005 | Ikeuchi | | 430/311 |
| 7,020,323 B2 * | 3/2006 | Nishizaka et al. | | 382/148 |
| 7,162,071 B2 * | 1/2007 | Hung et al. | | 382/144 |
| 2002/0040468 A1 * | 4/2002 | Uno et al. | | 716/19 |

* cited by examiner

*Primary Examiner* — Jingge Wu
*Assistant Examiner* — Utpal Shah
(74) *Attorney, Agent, or Firm* — Westerman, Hattori, Daniels & Adrian, LLP

(57) ABSTRACT

A pattern data processing method comprising, obtaining pattern data on a mask pattern, determining whether a processing time for the mask pattern in a processing software is reduced by rotating the mask pattern by a predetermined angle than a case where the mask pattern is processed in the processing software without being rotated, obtaining pattern data on a rotated pattern formed by rotating the mask pattern by the predetermined angle in the case that the processing time is reduced, processing the pattern data on the rotated pattern by using the processing software, and causing the mask pattern to return to its original direction.

20 Claims, 27 Drawing Sheets

| side | direction | length |
|---|---|---|
| ① | vertical | 5 |
| ② | horizontal | 5 |
| ③ | vertical | 1 |
| ④ | horizontal | 4 |
| ⑤ | vertical | 1 |
| ⑥ | horizontal | 2 |
| ⑦ | vertical | 1 |
| ⑧ | horizontal | 2 |
| ⑨ | vertical | 2 |
| ⑩ | horizontal | 1 |
| ⑪ | vertical | 3 |
| ⑫ | horizontal | 1 |
| ⑬ | vertical | 2 |
| ⑭ | horizontal | 2 |
| ⑮ | vertical | 2 |
| ⑯ | horizontal | 1 |
| ⑰ | vertical | 3 |
| ⑱ | horizontal | 4 |

| side | direction | length |
|---|---|---|
| ① | vertical | 5 |
| ② | horizontal | 5 |
| ③ | vertical | 1 |
| ④ | horizontal | 4 |
| ⑤ | vertical | 1 |
| ⑥ | horizontal | 2 |
| ⑦ | vertical | 1 |
| ⑧ | horizontal | 2 |
| ⑨ | vertical | 2 |
| ⑩ | horizontal | 1 |
| ⑪ | vertical | 3 |
| ⑫ | horizontal | 1 |
| ⑬ | vertical | 2 |
| ⑭ | horizontal | 2 |
| ⑮ | vertical | 2 |
| ⑯ | horizontal | 1 |
| ⑰ | vertical | 3 |
| ⑱ | horizontal | 4 |

PATTERN DATA PROCESSING SYSTEM, PATTERN DATA PROCESSING METHOD, AND PATTERN DATA PROCESSING PROGRAM

CROSS-REFERENCE TO RELATED APPLICATIONS

This application is based on and claims priority of Japanese Patent Application No. 2006-247976 filed on Sep. 13, 2006, the entire contents of which are incorporated herein by reference.

BACKGROUND OF THE INVENTION

The present invention relates to a pattern data processing system, a pattern data processing method, and a pattern data processing program.

In a process of manufacturing a semiconductor device such as an LSI, a photoresist is exposed in an exposure process. By using a resist pattern obtained by the exposure as a mask for etching, a fine device pattern such as a gate electrode is formed.

In the exposure process, a reduced image of a mask pattern formed on a surface of an exposure mask is projected onto a semiconductor wafer, but the image projected onto the wafer is not similar to the mask pattern due to optical proximity effect. Accordingly, in the stage of designing the exposure mask, a processing called OPC (Optical Proximity Correction) is generally carried out on the mask pattern so that the image of the mask pattern can coincide with the device pattern.

OPC is roughly classified into two types: rule-based OPC and model-based OPC. In both types, by inputting design data on a device pattern into a workstation or the like in which an OPC tool (software) is installed, the device pattern whose sides are caused to be uneven is outputted as design data on the mask pattern.

After the design data on the mask pattern is obtained in this manner, the process proceeds to a process of drawing the mask pattern on the exposure mask by using an EB (Electron Beam) exposure system.

However, a format of the above-described design data is different from that of drawing data used in the EB exposure system. For this reason, after carrying out OPC as described above, a processing called fracturing is carried out for converting the design data into the drawing data.

In this manner, in the stage of designing an exposure mask, processing such as OPC or fracturing is carried out. However, as semiconductor devices recently become highly integrated, time taken for such processings increasingly becomes longer. For example, compared with processing of obtaining design data on a mask pattern by generating a rectangle, OPC takes processing time longer several times to several tens of times, and a processing time typically is of several days. As for fracturing, it does not take such a longer time like OPC, but a several tens of hours of the processing time is taken.

When the processing times for OPC and fracturing are long as described above, a disadvantage is caused that a time period from the designing of an exposure mask to the completing of the exposure mask becomes longer.

It is also possible to obtain a resource such as a new facility or a software license to reduce the processing time. However, this causes an increase in developing costs of the exposure mask due to new facility investment.

Therefore, it is desired that the data processing time in the design stage of the exposure mask be reduced while the existing resources are effectively utilized.

SUMMARY OF THE INVENTION

According to one aspect of the present invention, there is provided a pattern data processing method comprising, obtaining pattern data on a mask pattern, determining whether a processing time for the mask pattern in a processing software is reduced by rotating the mask pattern by a predetermined angle than a case where the mask pattern is processed in the processing software without being rotated, obtaining pattern data on a rotated pattern formed by rotating the mask pattern by the predetermined angle in the case that the processing time is reduced, processing the pattern data on the rotated pattern by using the processing software, and causing the mask pattern to return to its original direction.

DESCRIPTION OF THE PREFERRED EMBODIMENTS (1) First Embodiment

In this embodiment, described is a system for carrying out processing such as OPC or fracturing on a mask pattern at the time of designing an exposure mask.

Figure 1:
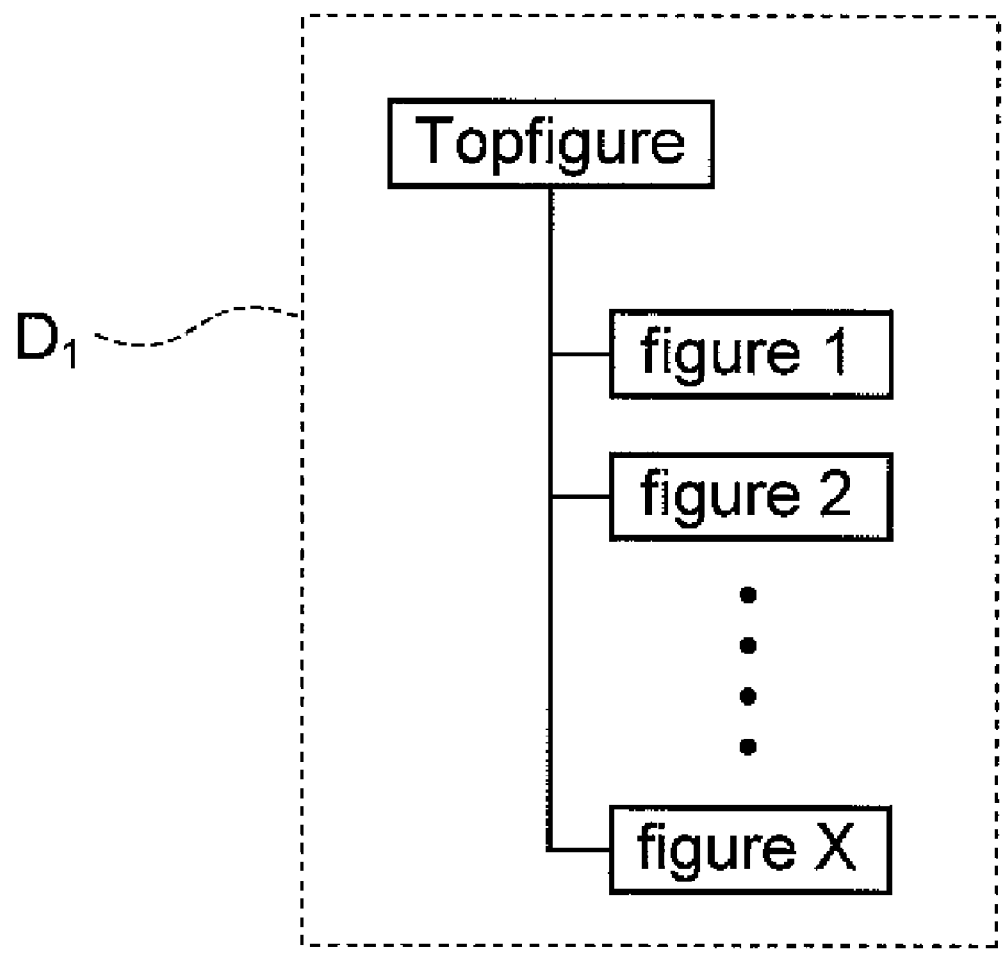
FIG. 1 is a diagram schematically showing a configuration of design data on a mask pattern used in each embodiment of the present invention.

FIG. 1 is a diagram schematically showing a structure of design data on a mask pattern used in the present embodiment.

Design data $D_1$ has a hierarchical structure composed of FIG. 1 to Figure X, and a Topfigure name is given thereto. The Topfigure name is used to identify each of the data $D_1$ in the case where a plurality of the design data $D_1$ are present.

Figure 2:
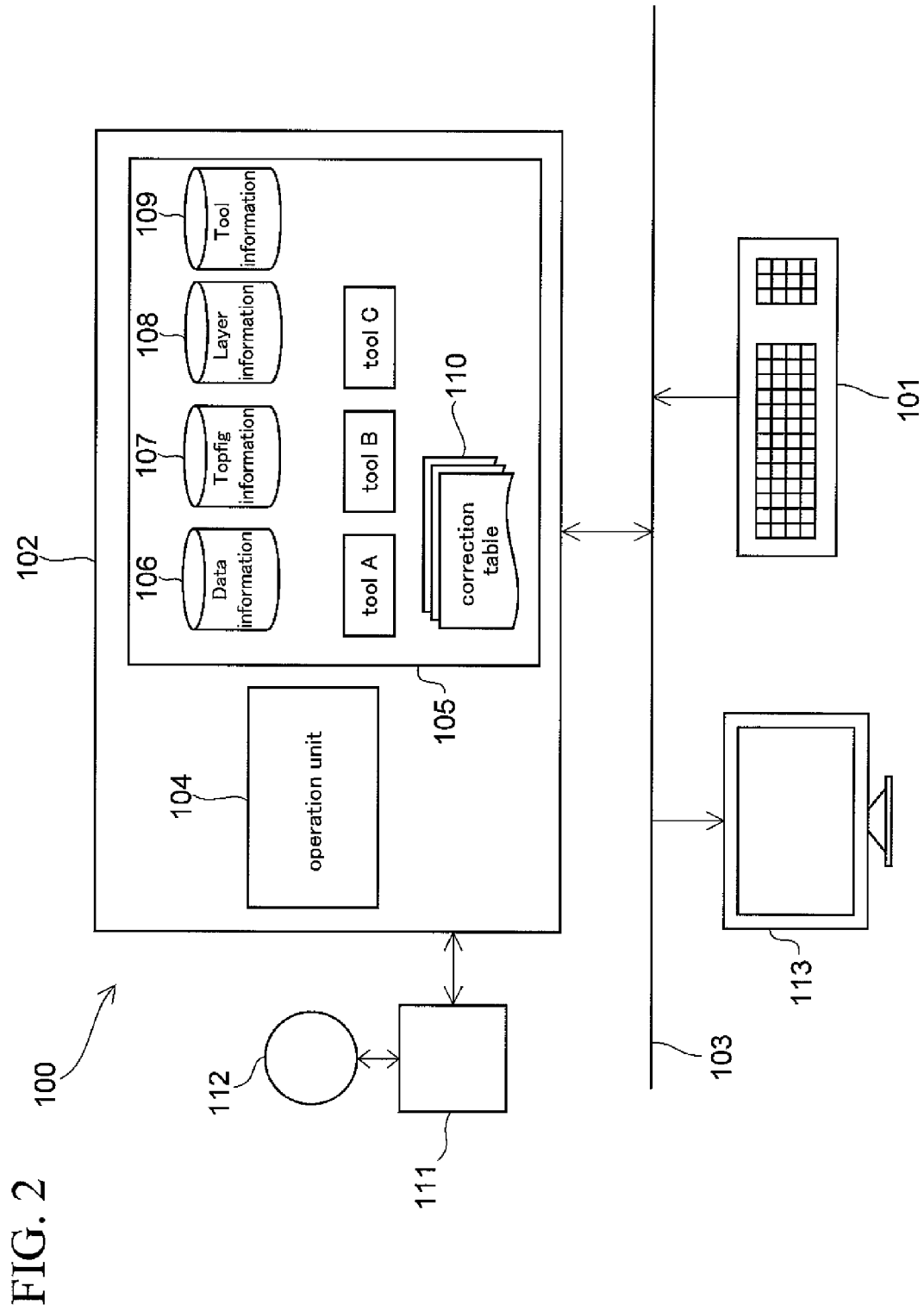
FIG. 2 is a configuration diagram of a pattern data processing system according to a first embodiment of the present invention.

FIG. 2 is a configuration diagram of a pattern data processing system according to the present embodiment.

The system 100 is, for example, a workstation that is briefly divided into a keyboard (input/output unit) 101 with which a designer performs input/output, a monitor 113, and a control unit 102 connected to the keyboard 101 through a bus 103. Note that a disk drive 111 for exchanging data with an external recording medium 112 is attached to the control unit 102.

The control unit 102 has an operation unit 104 such as a CPU (Central Processing Unit) and a storage unit 105 such as a hard disk drive or a RPM (Random Access Memory) Of these, the storage unit 105 has a Data information database 106, a Topfig information database 107, a Layer information database 108, and a tool information database 109.

The Data information database 106 has information on which layer of a device corresponds to design data $D_1$, e.g., information that design data $D_1$ is data for an interconnection layer.

On the other hand, the Topfigure name of the design data $D_1$ are stored in the Topfigure information database 107, and layer numbers of processing targets are stored in the Layer information database 108.

Then, a plurality of tools A to C are stored in the storage unit 105 as software for processing pattern data.

In the present embodiment, these tools A to C are software for rule-based OPC, and correction tables 110 needed for OPC are stored in the storage unit 105. Each of the correction tables 110 comprises, for example, a pair of the gap between adjacent mask patterns and the correction amount of the pattern.

Note that the OPC used in the embodiment is not limited to the rule-based OPC, but may be a model-based OPC.

The inventor of the present application found out that each of the tools A to C has advantages and disadvantages with respect to figures to be processed. For example, processing time in some tools is faster for a figure having the vertical side longer than the horizontal side than for a figure having the vertical side shorter than the horizontal side.

For this reason, in the present embodiment, before OPC is performed on the design data for products, it is investigated for each of the plural tools A to C which of figures takes longer processing time, the figure having a longer vertical side than a horizontal side, or the figure having a longer horizontal side than a vertical side. Then, the obtained results are stored in the tool information database 109 as information $D_2$ in advance.

Figure 3A:
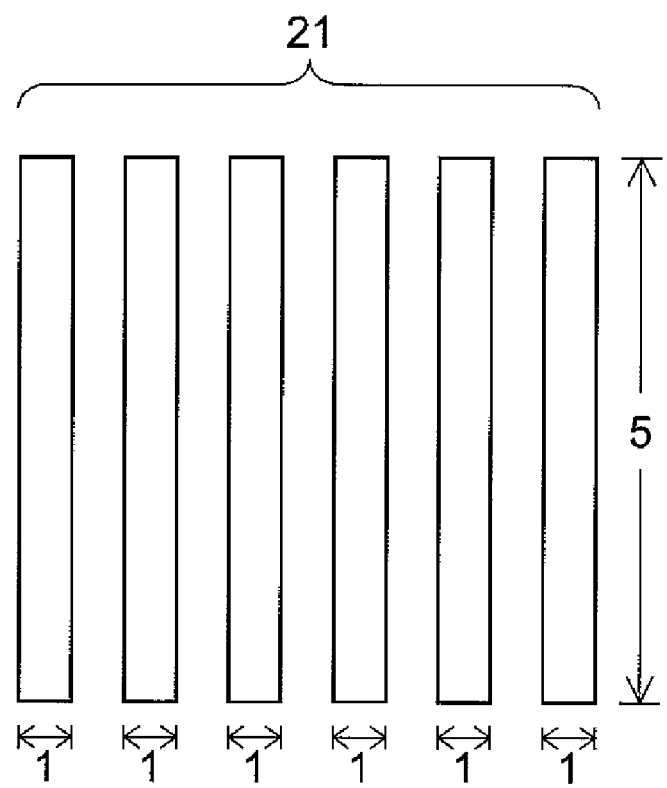
FIGS. 3A and 3B are plan views of a test pattern used in the first embodiment of the present invention.
Figure 3B:
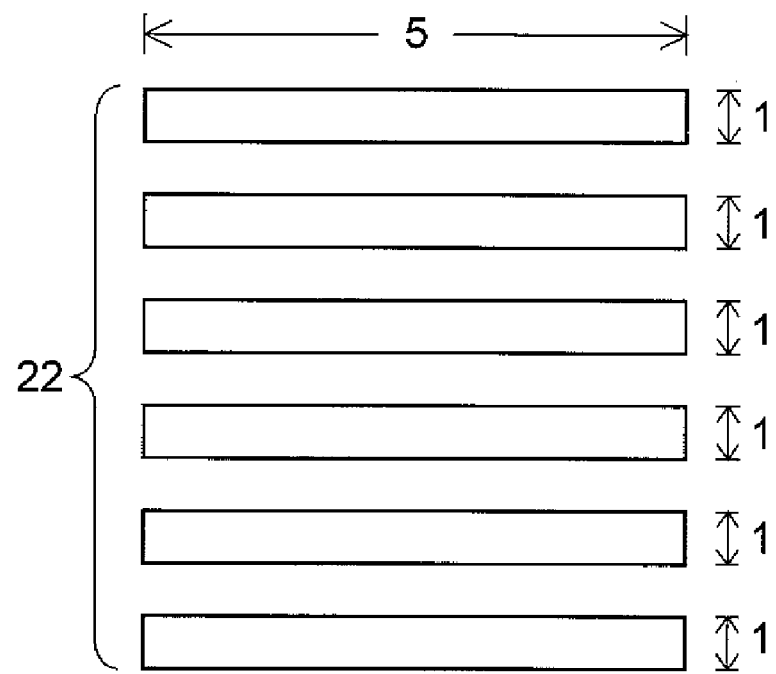

FIGS. 3A and 3B are plan views of test patterns 21 and 22 used in this investigation.

In the test pattern 21 in FIG. 3A, a total sum of lengths of vectors along the respective vertical sides is equal to 60, and a total sum of lengths of vectors along the respective horizontal sides is equal to 12. Accordingly, the test pattern 21 is a figure which has a longer vertical side.

In the following, a figure having a total sum of the lengths of the respective vertical sides larger than a total sum of the lengths of the respective horizontal sides is referred to as a "vertical figure."

On the other hand, in the test pattern 22 in FIG. 3B, a total sum of lengths of vectors along the respective vertical sides is equal to 12, and a total sum of lengths of vectors along the respective horizontal sides is equal to 60. Accordingly, the test pattern 21 is a figure which has a longer horizontal side.

In the following, a figure having a total sum of the lengths of the respective horizontal sides larger than a total sum of the lengths of the respective vertical sides is referred to as a "horizontal figure."

In the above-described investigation, it is examined which of test patterns 21 and 22 takes shorter processing time for each of the tools A to C. On the basis of the investigation, decision is made on which figure to be favorite for each of the tools A to C, the vertical figure or the horizontal figure.

Next, a method of processing the design data using this system 100 is described.

Figure 4:
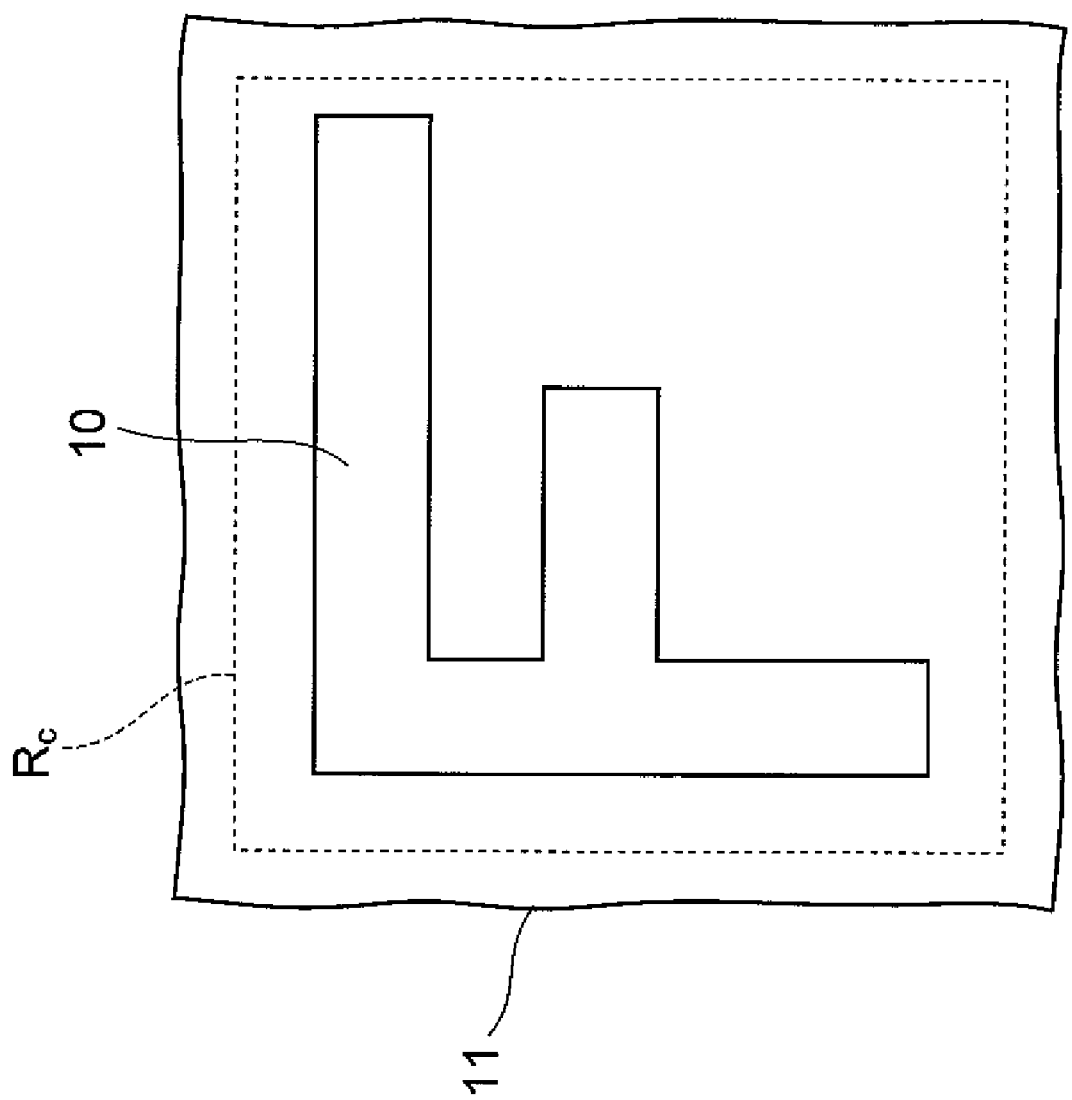
FIG. 4 is a plan view of a mask pattern used in the first embodiment of the present invention.

FIG. 4 is a plan view of a mask pattern 10 formed in a chip region $R_c$ of an exposure mask 11. Note that the outline of the chip region $R_c$ corresponds to an outer periphery of one chip to be formed in a semiconductor wafer.

In the following processing flow, as pattern data to be processed in the system 100, the design data $D_1$ of this mask pattern 10 is used. Then, the OPC is applied to the design data $D_1$ by using a tool suitable for a target product, for example, the tool A, among the tools A to C.

Figure 5:
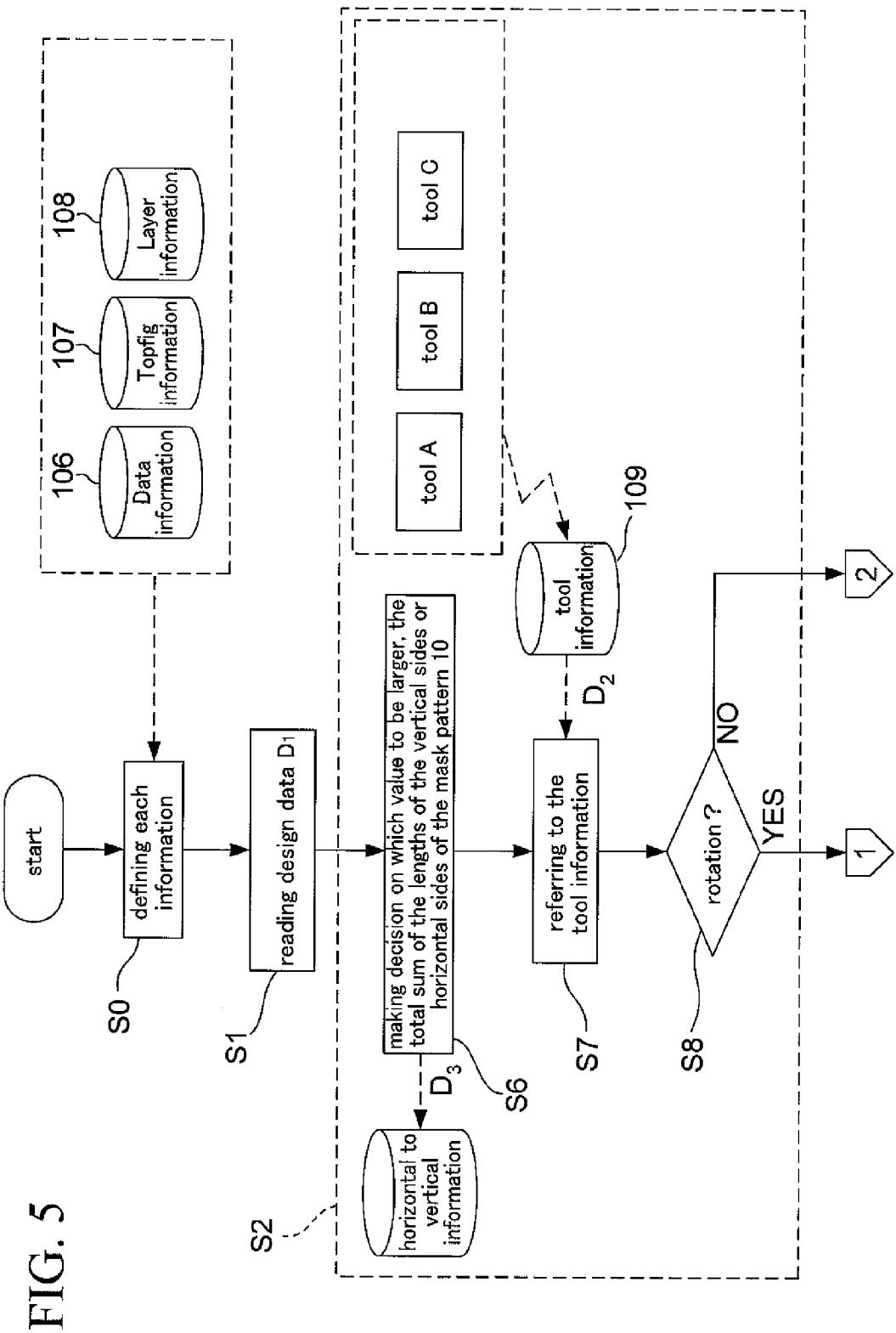
FIG. 5 is a flowchart (No. 1) for describing a pattern data processing method according to the first embodiment of the present invention.
Figure 6:
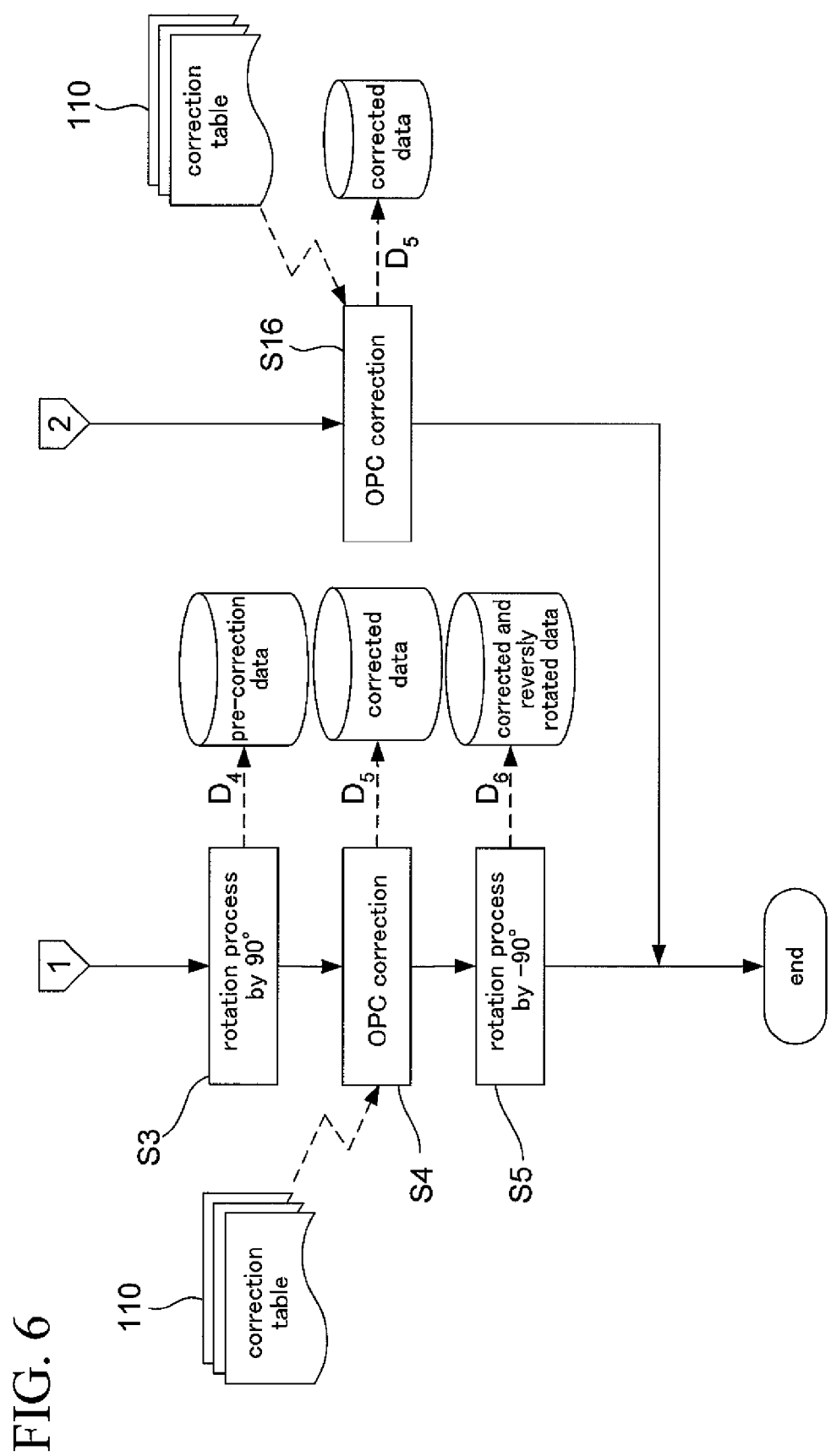
FIG. 6 is a flowchart (No. 2) for describing a pattern data processing method according to the first embodiment of the present invention.

FIGS. 5 and 6 are flowcharts for describing a pattern data processing method according to the present embodiment.

Steps S0 to S8 and S16 in these flowcharts are stored in the form of a program, for example, in the recording medium 112, and each program is executed by the operation unit 104 by installing the program in the system 100.

At the first Step S0, the designer refers to the Data information database 106 to define which layer of the device is a target of the design data $D_1$ to be processed from now. Moreover, a Topfig name for identifying the data $D_1$ is defined by referring to the Topfig information database 107, and a layer number of the processing target is defined by referring to the Layer information database 108.

Next, proceeding to Step S1, the design data $D_1$ recorded in the recording medium 112 is read at the disk drive X11 under the control of the operation unit 104.

Then, the process proceeds to Step S2. Step S2 is divided into Sub-steps S6 to S8.

In the first Sub-step S6, on the basis of the design data $D_1$ obtained in Step S1, decision is made on which value to be larger, the total sum of the lengths of the vertical sides of the mask pattern 10, or the total sum of the lengths of the horizontal sides thereof. The decision result is stored in the storage unit 105 as horizontal to vertical ratio information $D_3$.

Figure 7:
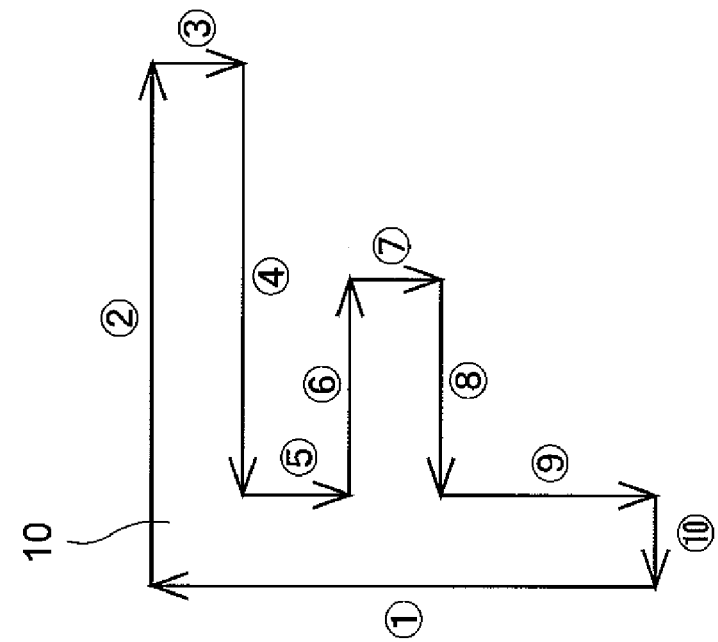
FIG. 7 is a plan view for describing processing contents of Step S6 in the first embodiment of the present invention.

FIG. 7 is a plan view for describing how this decision is made.

As shown in FIG. 7, for making this decision, vectors along each side of the mask pattern 10 are firstly defined, and then the lengths of the vectors are calculated. The vector length can be obtained from an absolute value of the difference between position coordinates of adjacent vertexes by referring to position coordinates of vertexes included in the design data $D_1$, for example.

After that, a total sum of the vector lengths in the vertical direction and a total sum of the vector lengths in the horizontal direction are obtained, and then it is determined which of the total sums is larger.

In this example, the total sum of the vector lengths in the vertical direction is 10 and the total sum of the vector lengths in the horizontal direction is 14. Accordingly, the mask pattern 10 can be decided as a horizontal figure in which the total sum of the lengths of the horizontal sides is larger than the total sum of the lengths of the vertical sides.

Next, the process proceeds to Step S7 in FIG. 5.

In Step S7, by referring to the tool information database 109, the information $D_2$ is obtained. The information $D_2$ contains information on which of the vertical and horizontal figures takes shorter processing time in the tool A. In the present embodiment, it is assumed that the vertical figure needs shorter processing time in the tool A than the horizontal figure, and this information is included in the information $D_2$.

Next, the process proceeds to Step S8. In Step S8, based on the decision result (the horizontal to vertical ratio information $D_3$) in Step S6 and the information $D_2$ referred in Step S7, determination is made whether the processing time in the tool A is more reduced by rotating the mask pattern 10 by 90° in a plane than processed without rotation.

In this example, since the mask pattern 10 is a horizontal figure, and the processing time in the tool A is shorter for the vertical figure as described above, it is determined that the processing time is reduced (YES).

Next, the process proceeds to Step S3 in FIG. 6.

Figure 8:
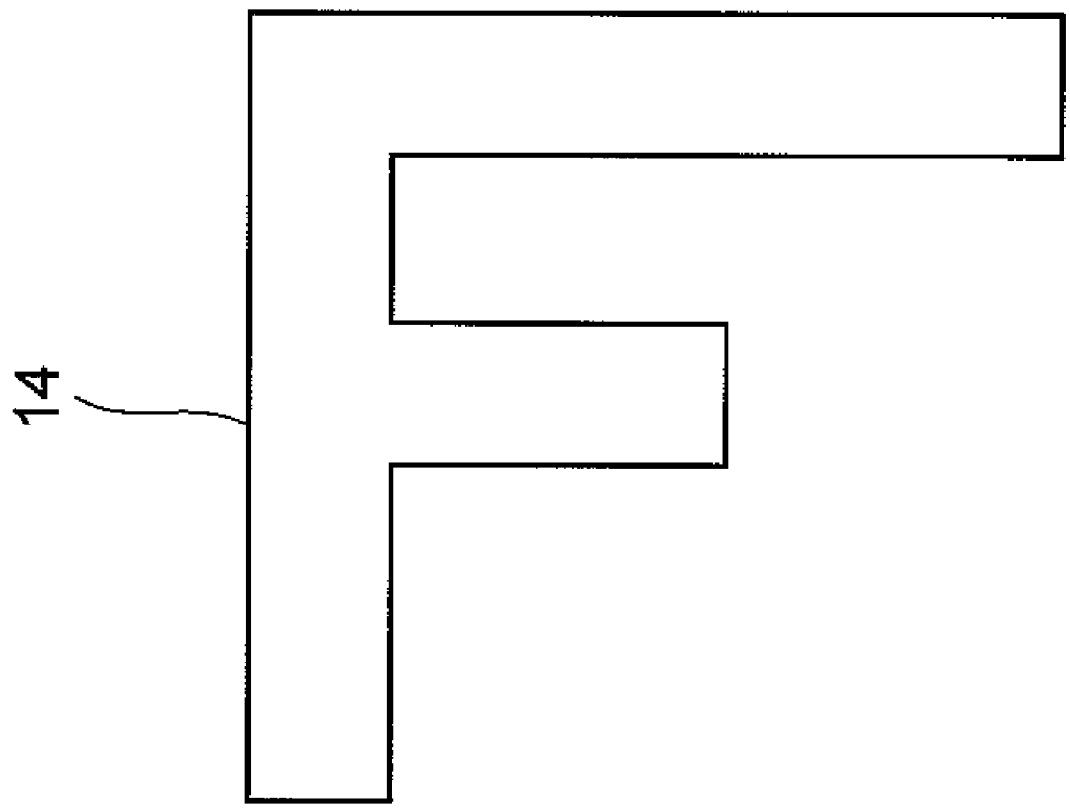
FIG. 8 is a plan view schematically showing processing contents of Step S3 in the first embodiment of the present invention.

FIG. 8 is a plan view schematically showing a processing content in Step S3. In Step S3, as shown in FIG. 8, in the operation unit 104, pattern data $D_4$ of the rotated pattern 14 formed by rotating the mask pattern 10 at 90° by using the design data $D_1$ is generated.

Since commercially available OPC software and fracturing software include the function to rotate a pattern, this rotating operation can be performed by using this function. In addition, in FIG. 8, the mask pattern 10 is rotated in the clockwise direction to obtain the rotated pattern 14, but the rotated pattern 14 may be obtained by rotating it in the counterclockwise direction.

Then, the pattern data $D_4$ is stored in the storage unit 105 as pre-correction data.

Next, the process proceeds to Step S4 in FIG. 6. With referring to the correction tables 110, the pattern data $D_4$ of the rotated pattern 14 is processed in the tool A, and the OPC is applied to the rotated pattern 14.

Figure 9:
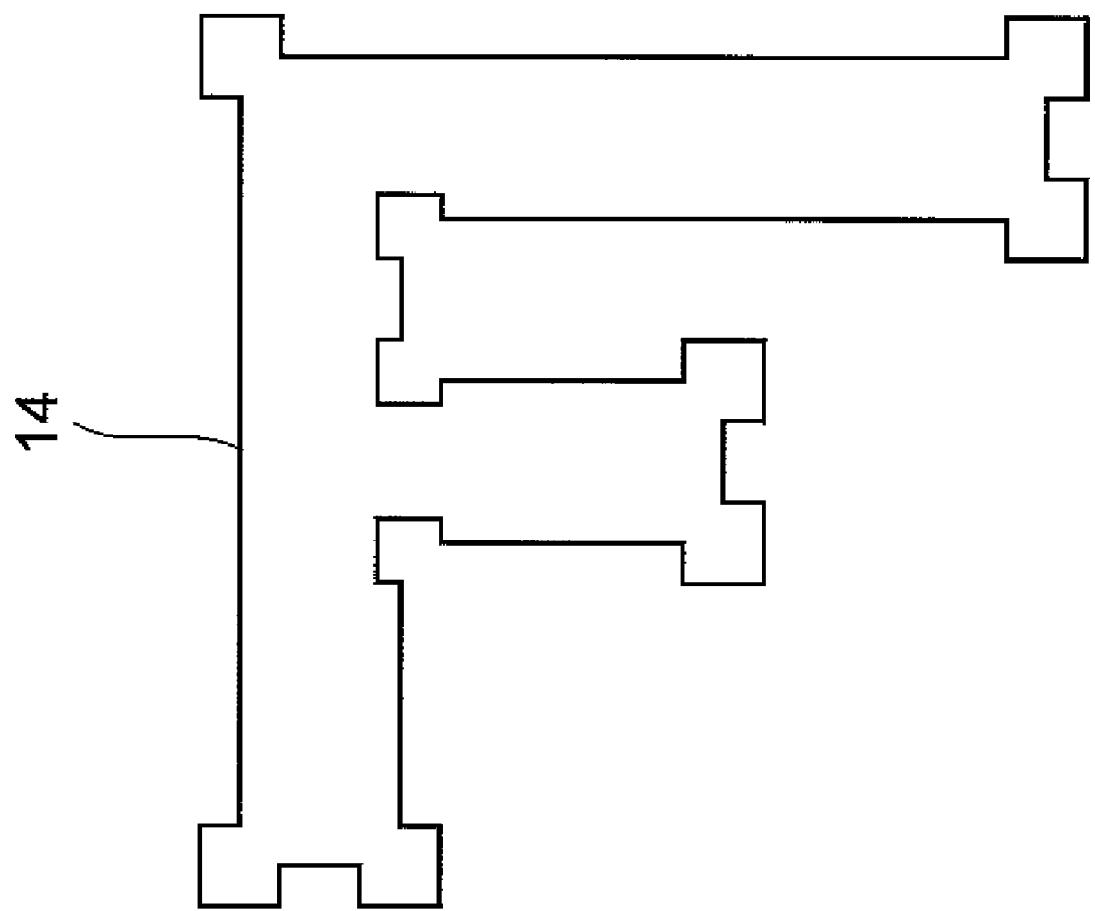
FIG. 9 is a plan view schematically showing processing contents of Step S4 in the first embodiment of the present invention.

FIG. 9 is a plan view of the rotated pattern 14 to which the OPC is applied in this manner. The pattern data $D_5$ of the rotated pattern 14 after the OPC is stored in the storage unit 105 as post-correction data.

Next, the process proceeds to Step S5. Using the pattern data $D_5$ in the operation unit 104, the rotated pattern 14 is reversely rotated by 90°, so that the mask pattern 10 is caused to return to its original direction.

Figure 10:
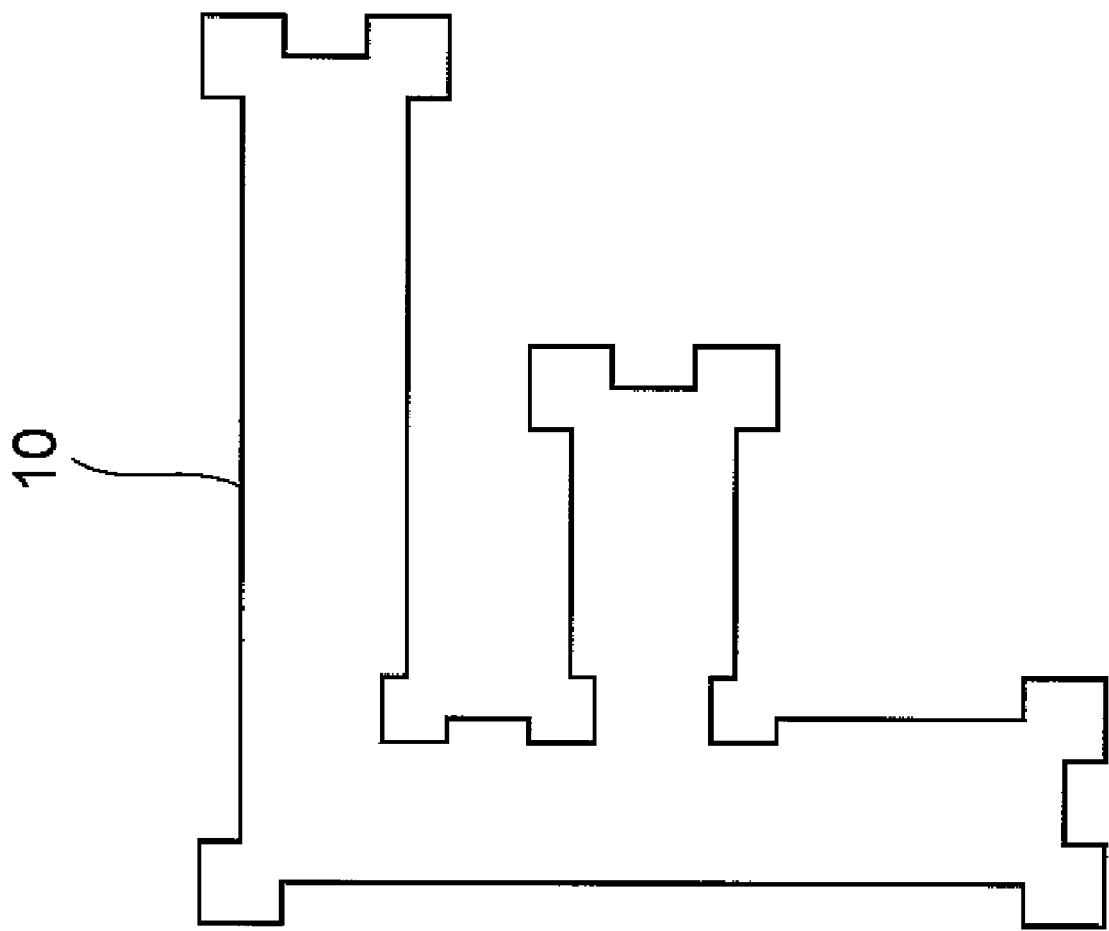
FIG. 10 is a plan view schematically showing processing contents of Step S5 in the first embodiment of the present invention.

FIG. 10 is a plan view of the mask pattern 10 reversely rotated in this manner. The pattern data $D_6$ of the mask pattern 10 is stored in the storage unit 105 (see, FIG. 2) as corrected and reversely rotated data. In addition, the pattern data $D_6$ can be stored in the recording medium 112 as necessary.

Since the mask pattern 10 is a horizontal figure in this example, it is determined in Step S8 to rotate (YES) the mask pattern 10. However, in the case where the mask pattern 10 is a vertical figure, it is determined in Step S8 not to rotate (No) the mask pattern 10, and the process proceeds to Step S16.

In Step S16, the OPC is applied to the design data $D_1$ of the mask pattern 10 by using the correction tables 110, and the data $D_5$ after the processing is stored in the storage unit 105 as corrected data.

By these steps, main steps of the pattern data processing method according to the present embodiment have completed.

According to the present embodiment, information on which of the vertical figure and the horizontal figure needs shorter processing time by the tool A is obtained in advance. Then, by using this information, the mask pattern 10 is rotated in the direction that the tool A is good at processing in Step S3. Accordingly, a time required for OPC in Step S4 can be reduced.

In addition, there is a tool among the tools A to C which can reduce the data volume of the output data $D_6$ by carrying out processing after rotating the mask pattern 10 in a manner described above. Accordingly, time for handling data, such as time for transferring data, can be reduced, and a region in the recording medium 112, where the output data $D_6$ occupies, can be reduced.

Furthermore, additional facility is not required for this method. Therefore, the existing resources such as workstation and OPC tools are effectively utilized and, at the same time, it becomes possible that the data processing time in the design stage of the exposure mask is reduced.

(2) Second Embodiment

Figure 11:
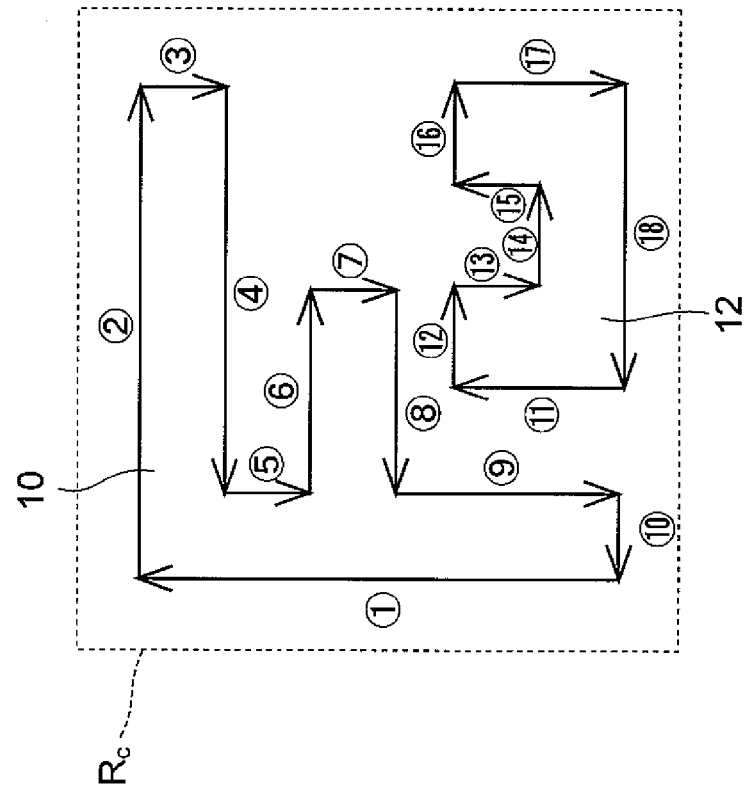
FIG. 11 is a plan view of a mask pattern used in a second embodiment of the present invention.

In the example in FIG. 4 of the first embodiment, only one mask pattern 10 is formed in one chip region $R_c$. However, in an actual device, as shown in FIG. 11, a plurality of mask patterns 10 and 12 are formed in one chip region $R_c$.

In the present embodiment, each of the patterns 10 and 12 is considered as one figure, and process is simultaneously performed on these patterns 10 and 12 according to the flows of FIGS. 5 and 6 of the first embodiment.

For example, a total sum of lengths of vertical sides and a total sum of lengths of horizontal sides of the mask pattern 12 are respectively 10 and 8. Accordingly, a total sum of the lengths of the vertical sides of both patterns 10 and 12 is 20 (=10+10), and a total sum of all the lengths of the horizontal sides thereof is 22 (=14+8). Accordingly, in Step S6 of FIG. 5, the patterns 10 and 12, as a whole, are decided as a horizontal figure.

Accordingly, in Step S8 of FIG. 5, both mask patterns 10 and 12 are collectively rotated by 90° to cause the mask patterns 10 and 12 to be a vertical figure that the tool A is good at processing.

Figure 12:
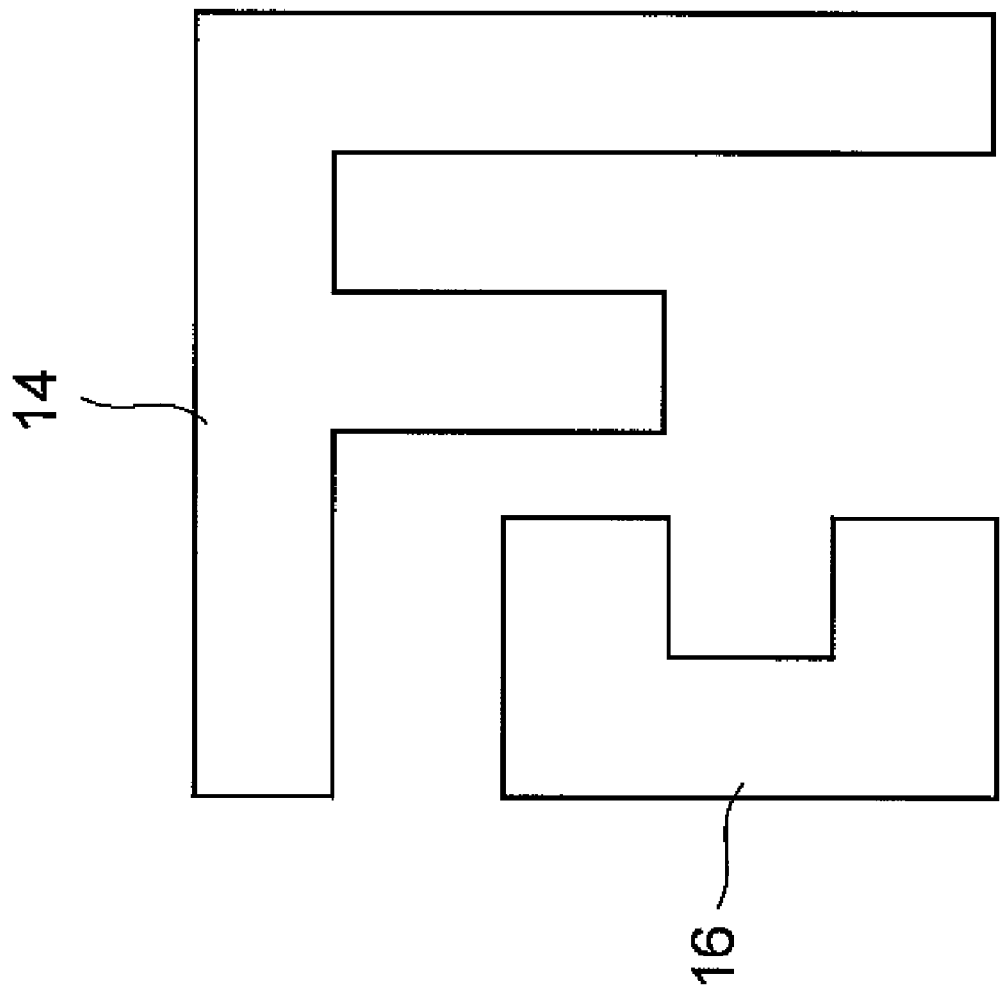
FIG. 12 is a plan view of a rotated pattern obtained by rotating the mask pattern used in the second embodiment of the present invention.

FIG. 12 is a plan view of rotated patterns 14 and 16 obtained by rotating the patterns 10 and 12 in this manner.

After this step, similar to the first embodiment, process in Steps S3 to S5 of FIG. 6 is performed.

According to the above-described present embodiment, even in the case where a plurality of mask patterns 10 and 12 exists in one chip region $R_c$ as shown in FIG. 11, it is possible to decide whether the figure is vertical figure or horizontal by regarding the both patterns 10 and 12 as one figure as a whole. With this, it becomes possible that the design data on each of the patterns 10 and 12 is processed in a similar way to that of the first embodiment, and thus the processing time can be reduced.

(3) Third Embodiment

In the first embodiment, as shown in FIG. 4, the target mask pattern 10 is the integral figure.

Figure 13:
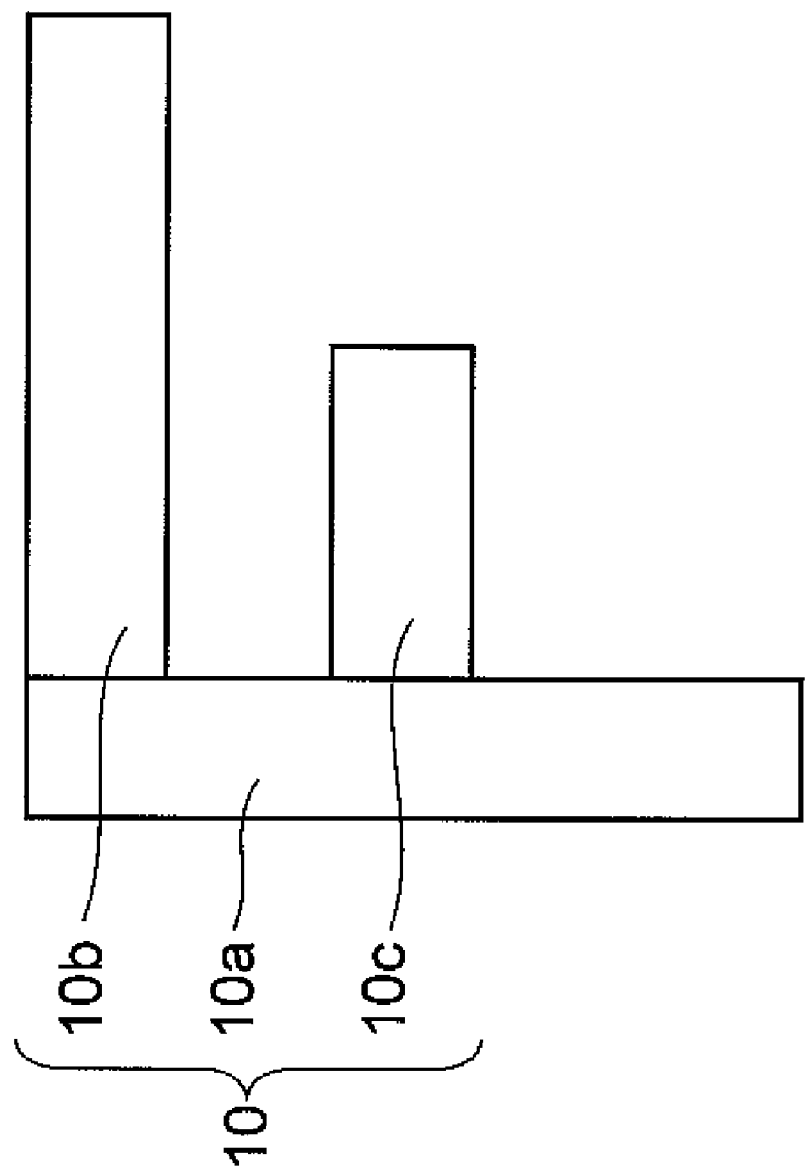
FIG. 13 is a plan view (No. 1) of a mask pattern used in a third embodiment of the present invention.
Figure 14:
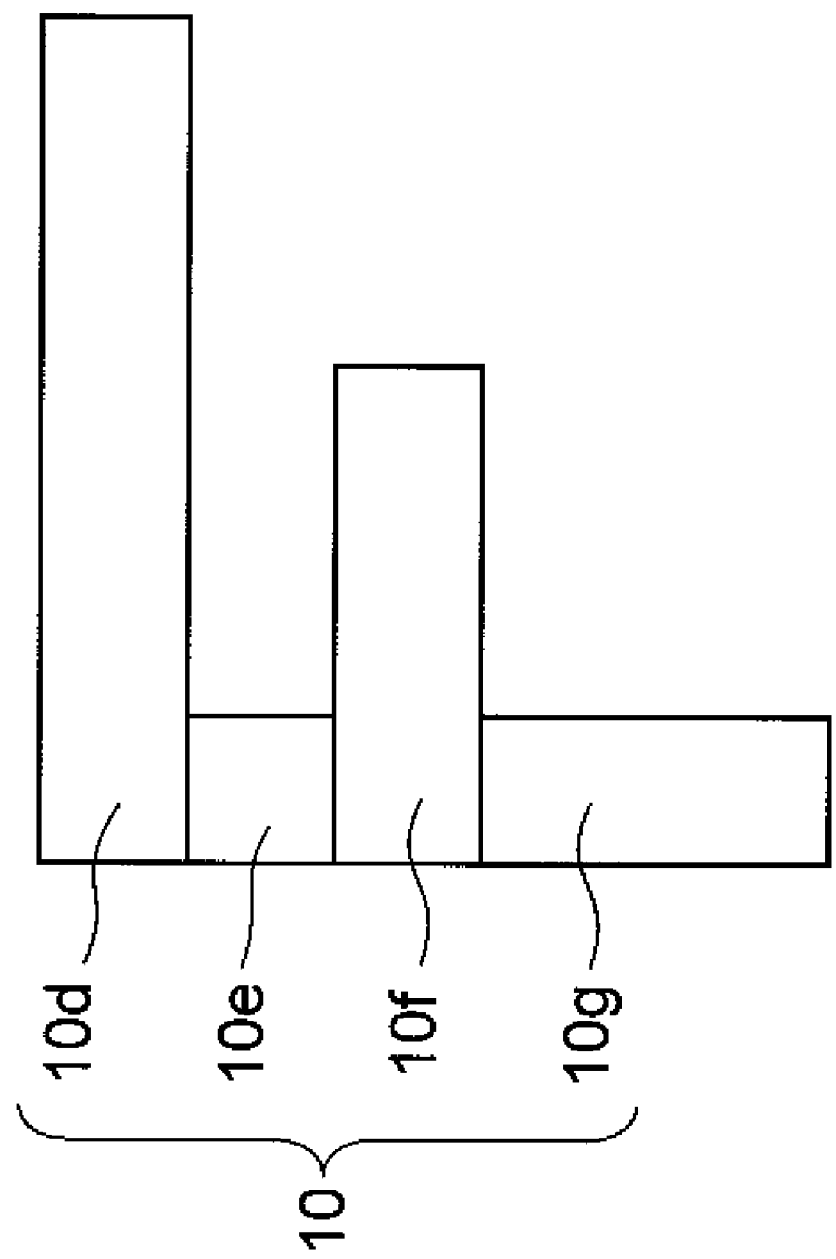
FIG. 14 is a plan view (No. 2) of a mask pattern used in the third embodiment of the present invention.

However, as shown in FIG. 13, the mask pattern 10 is composed of a group of a plurality of FIGS. 10a to 10c because of the designer's convenience in some cases. Furthermore, shapes of the respective figures constituting the mask pattern 10 may vary depending on the time of designing. Therefore, there is also a case where the mask pattern 10 is formed of FIGS. 10d to 10g as shown in FIG. 14.

In the present embodiment, in such a case, the reduction in the processing time for the design data on the mask pattern 10 is achieved by carrying out Step S6 described in FIG. 5 as each of the following examples.

FIRST EXAMPLE

Figure 15:
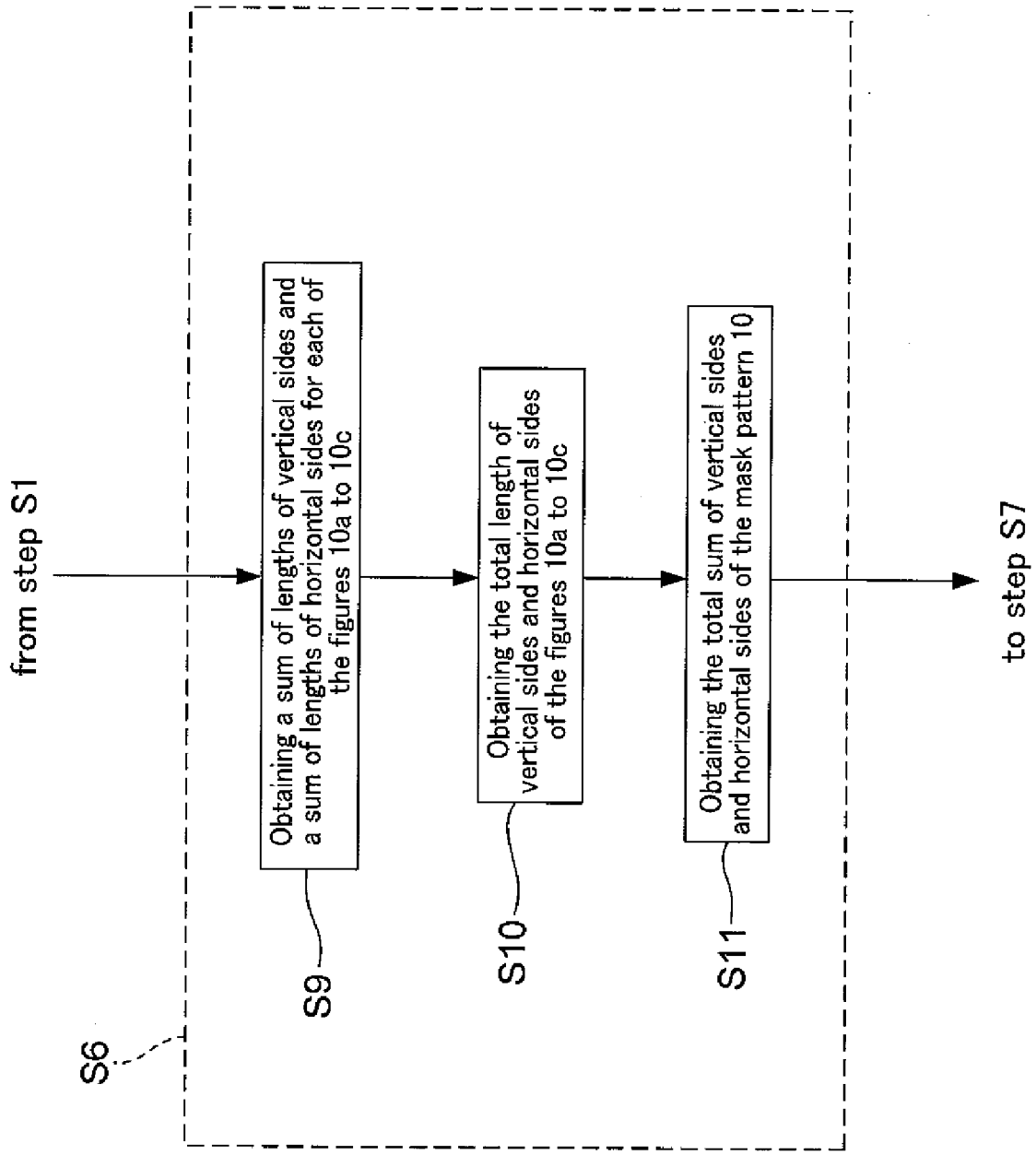
FIG. 15 is a flowchart showing details of Step S6 in a first example of the third embodiment of the present invention.

FIG. 15 is a flowchart showing details of Step S6 in the present example. Note that Steps other than Step S6 are the same as those in the first embodiment, so that the description thereof is omitted below.

Figure 16:
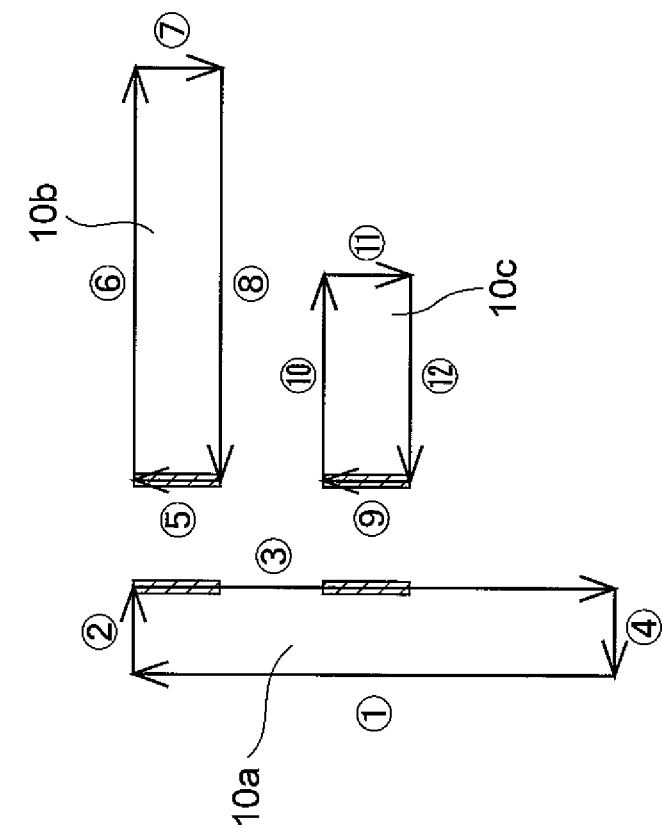
FIG. 16 is a diagram (No. 1) for describing processing contents of Step S6 in the first example of the third embodiment of the present invention.

FIG. 16 is a diagram for describing processing contents of Step S6 in the case where the mask pattern 10 is divided into figures like FIG. 13.

As shown in FIG. 15, Step S6 is composed of Sub-steps S9 to S11.

In the first Step S9, as in FIG. 16, a sum of lengths of vertical sides and a sum of lengths of horizontal sides are obtained for each of the plural FIGS. 10a to 10c.

In this example, the sum of the lengths of vertical sides and sum of the lengths of the horizontal sides of the FIG. 10a are respectively 10 and 2. In addition, the sum of the lengths of the vertical sides and the sum of the length of the horizontal sides of the FIG. 10b are respectively 2 and 8. Moreover, the sum of the lengths of the vertical sides and the sum of the lengths of the horizontal sides of the FIG. 10c are respectively 2 and 4.

Next, the process proceeds to Step S10 to obtain the total length of vertical sides by adding the sums of the total lengths of the vertical sides of all of the respective FIGS, 10a to 10c together. In addition, the total length of horizontal sides is obtained by adding the sums of the total lengths of the horizontal sides of all of the respective FIGS. 10a to 10c together.

In the above-described example, the total length of the vertical side is 14 (=10+2+2), and the total length of the horizontal sides is 14 (=2+8+4).

Subsequently, the process proceeds to Step S11 to obtain a total sum of the lengths of the vertical sides of the mask pattern 10 by subtracting the length of the vertical sides which are shared by the plural FIGS. 10a to 10c from the total length of the vertical sides obtained in Step S10.

In this example, the vertical sides shown by hatching in FIG. 16 are shared by the plural figures. There are four shared sides in total and each length thereof is 1. Accordingly, a total sum of the vertical sides of the mask pattern 10 becomes 10 (=14−1−1−1−1).

In addition, a sum of the horizontal sides of the mask pattern 10 is obtained by subtracting the length of the horizontal sides which are shared by the FIGS. 10a to 10c from the total length of the horizontal sides obtained in Step S10.

In the above-described example, there is no horizontal side which is shared by the FIGS. 10a to 10c. Accordingly, the above-described total length of 14 per se becomes a total sum of the horizontal sides of the mask pattern 10.

Up to this, Step S6 in the present embodiment is completed.

According to the present embodiment, even in the case where a designer designs the mask pattern 10 with the FIGS. 10a to 10c like FIG. 14, a total sum of vertical sides and a total sum of horizontal sides of the mask pattern 10 can be obtained. Accordingly, OPC can be performed on the design data $D_1$ of the mask pattern 10 in short time by following the flows of FIGS. 5 and 6.

Figure 17:
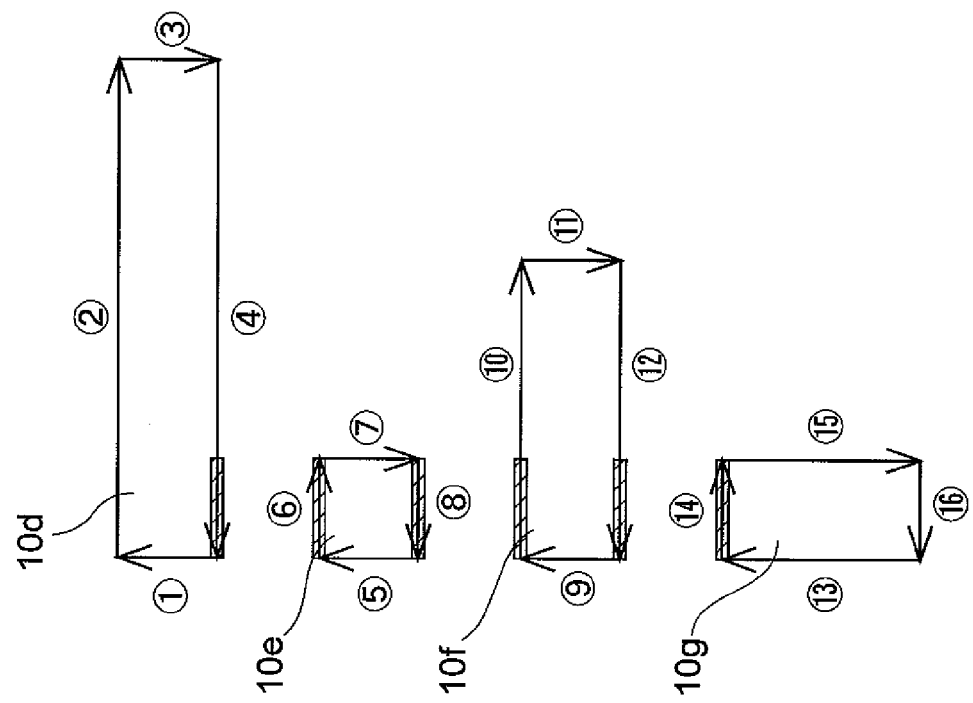
FIG. 17 is a diagram (No. 2) for describing the processing contents of Step S6 in the first example of the third embodiment of the present invention.

It is to be noted that even in the case where the mask pattern 10 is constructed from FIGS. 10d to 10g like FIG. 17, the total length of vertical sides and the total length of horizontal sides are calculated for each of the FIGS. 10d to 10g, and the process is performed by following the above-described flows, so that a total sum of the vertical sides and total sum of the horizontal sides of the mask pattern 10 can be obtained.

SECOND EXAMPLE

Next, a second example of the present embodiment is described.

Figure 18:
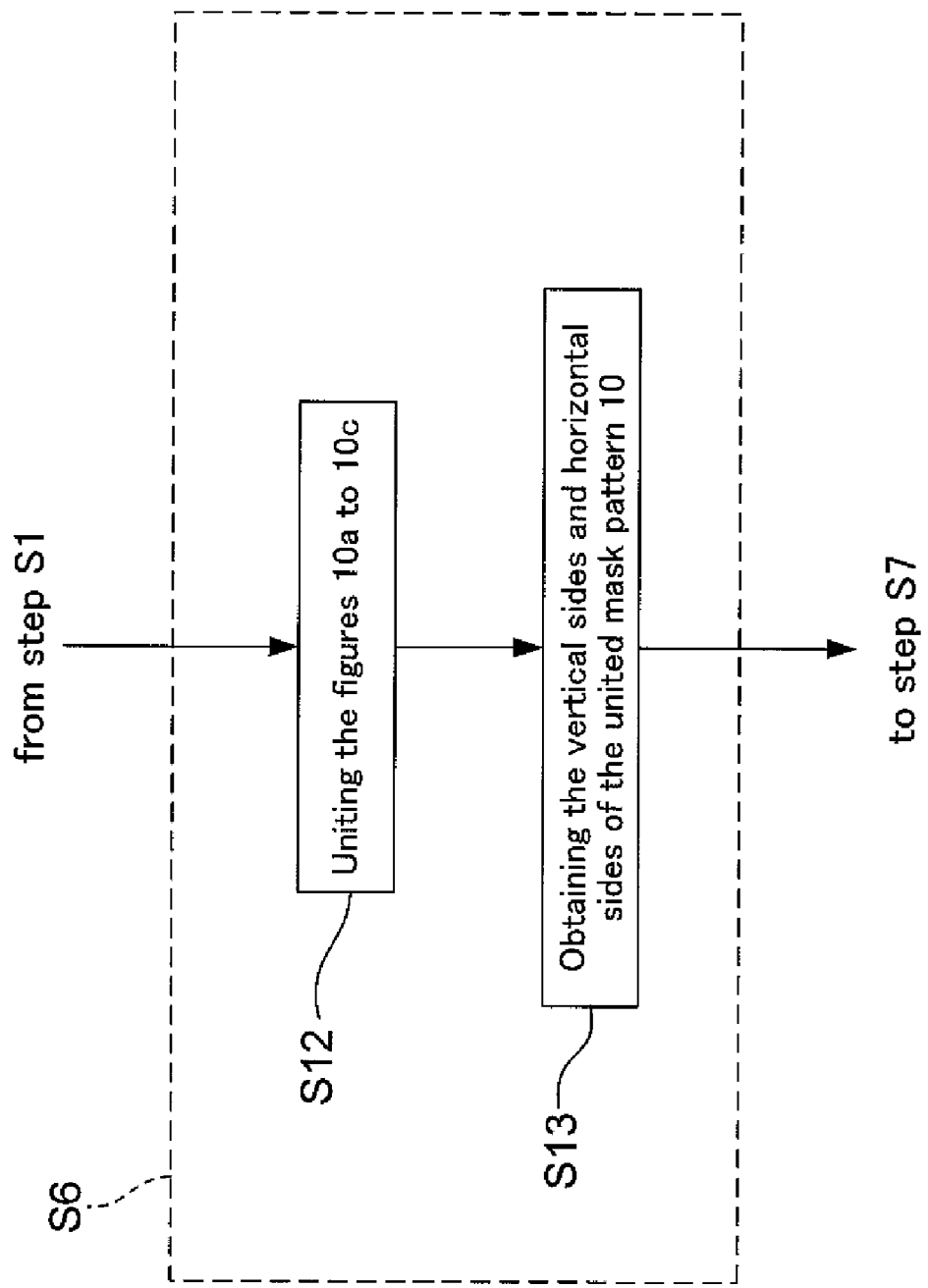
FIG. 18 is a flowchart showing details of Step S6 in a second example of the third embodiment of the present invention.

FIG. 18 is a flowchart showing details of Step S6 in the present example. It is to be noted that Steps other than Step S6 are the same as those in the first embodiment, and the description thereof is omitted below. In addition, FIG. 19 is a plan view for describing process contents of Step S6 in the present embodiment.

As shown in FIG. 18, Step S6 is constructed from Sub-steps S12 and S13.

In the first Step S12, as shown in FIG. 14, in the case where the mask pattern 10 is formed of a group of the plural FIGS. 10a to 10c, OR operation is performed on data on shapes of these FIGS. 10a to 10c to unite the FIGS. 10a to 10c.

Figure 19:
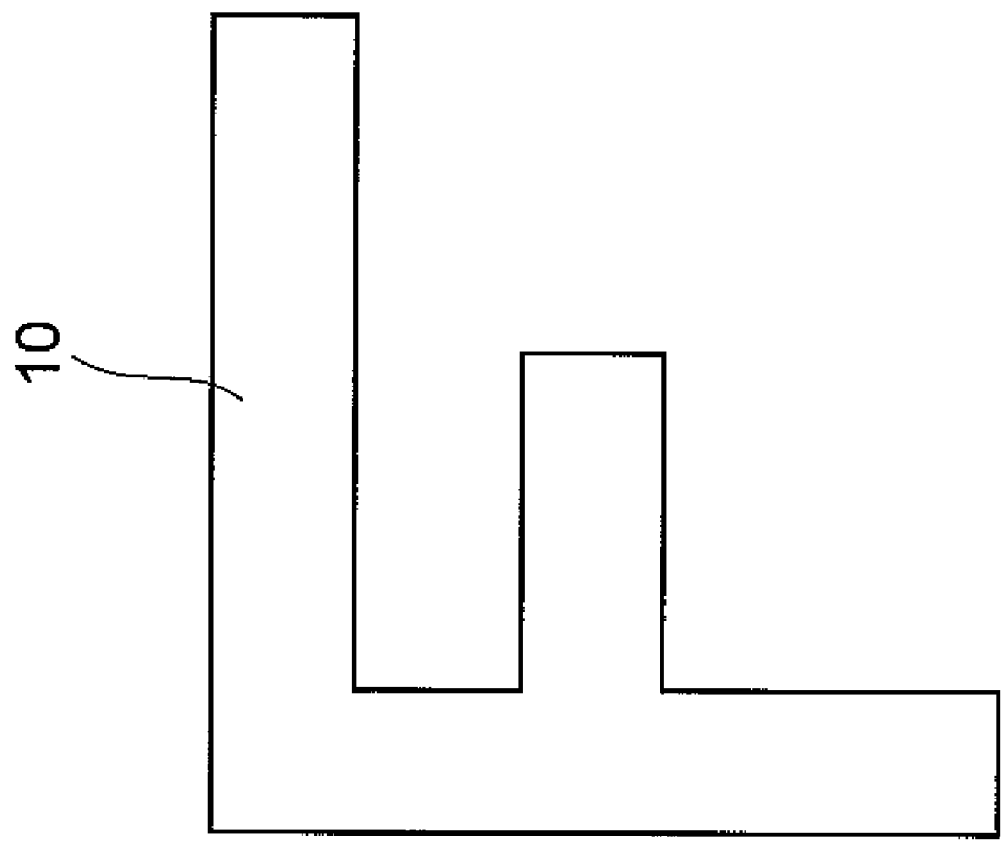
FIG. 19 is a diagram describing details of processing contents of Step S6 in the second example of the third embodiment of the present invention.

With such uniting operation, the mask pattern 10 becomes an integrated figure as shown in FIG. 19.

Next, the process proceeds to Step S13 to obtain a total sum of the lengths of respective vertical sides and a total sum of the lengths of respective horizontal sides of the united mask pattern 10. The way to obtain the total sum is the same as that of the first embodiment, and the description thereof is omitted.

Up to this, Step S6 in the present embodiment is completed.

In the present example, even when a designer designs the mask pattern 10 by dividing it into the FIGS. 10a to 10c, the mask pattern 10 is processed as one integrated shape by uniting these FIGS. 10a to 10c. Accordingly, OPC can be performed on the mask pattern 10 by following the same flow as that of the first embodiment and time required for OPC can be reduced.

(4) Fourth Embodiment

In the second embodiment, by following the flows of FIGS. 5 and 6, the processing is collectively performed on all of the mask patterns formed in one chip region $R_c$.

In contrast, in the present embodiment, on each of a plurality of mask patterns in one chip, process is performed independently as described below.

Figure 20:
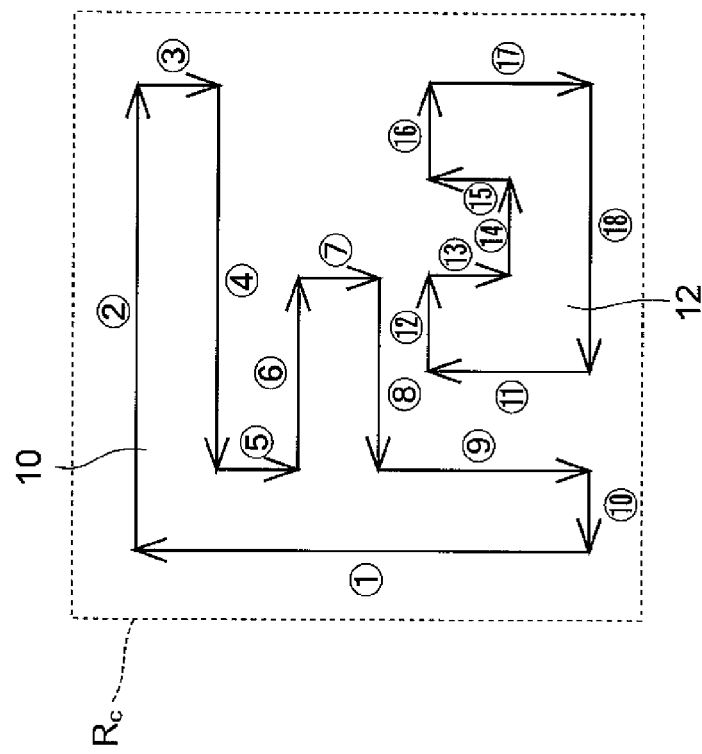
FIG. 20 is a plan view of a mask pattern used in a fourth embodiment of the present invention.

FIG. 20 is a plan view of the mask patterns 10 and 12 to be processed in the present embodiment. Data on the mask patterns 10 and 12 are stored respectively in Figures of design data $D_1$, which are different from each other.

Figure 21:
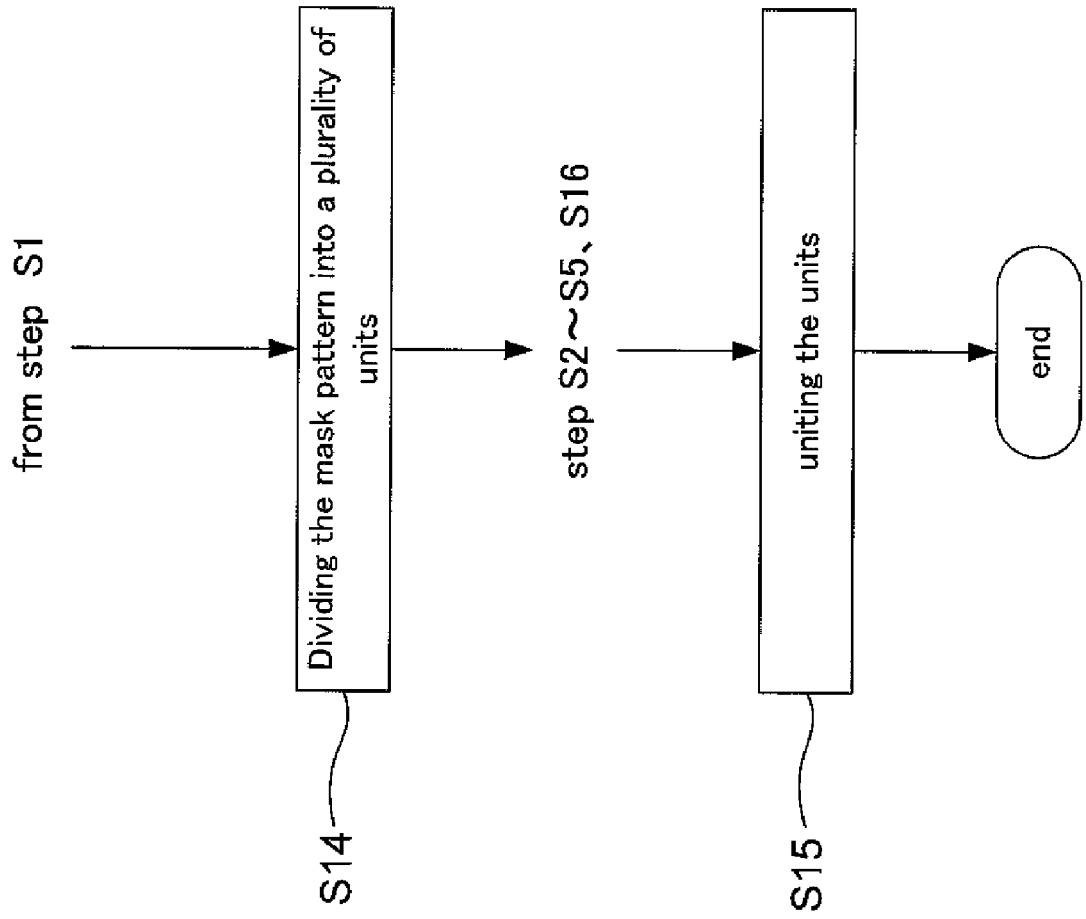
FIG. 21 is a flowchart for describing a pattern data processing method according to the fourth embodiment of the present invention.

FIG. 21 is a flowchart of a processing method of design data according to the present embodiment.

As shown in FIG. 21, in the present embodiment, Steps 14 and 15 are performed in addition to the Steps of the first embodiment, and other than this, the present embodiment is the same as the first embodiment.

Figure 22:
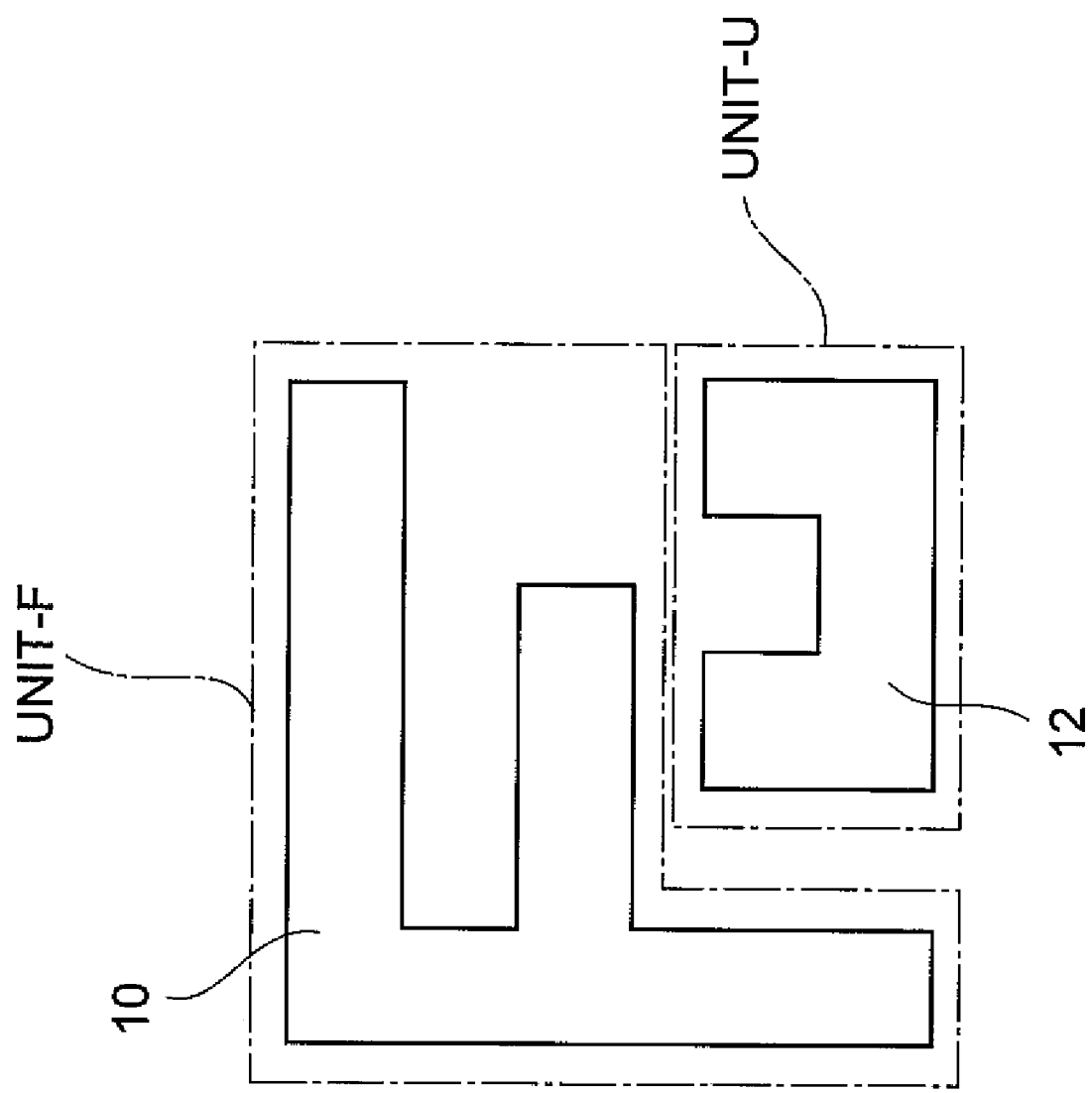
FIG. 22 is a diagram for describing processing contents of Step S14 of the fourth embodiment of the present invention.

Firstly, after Steps S0 and S1 are performed according to the first embodiment, the process proceeds to Step S14. In Step S14, as shown in FIG. 22, a mask pattern is divided into a plurality of units. In this example, the mask pattern 10 is divided into UNIT-F and the mask pattern 12 is divided into UNIT-U.

Next, Steps S2 to S5 and S16 are performed on each of the UNIT-F and the UNIT-U.

Figure 23B:
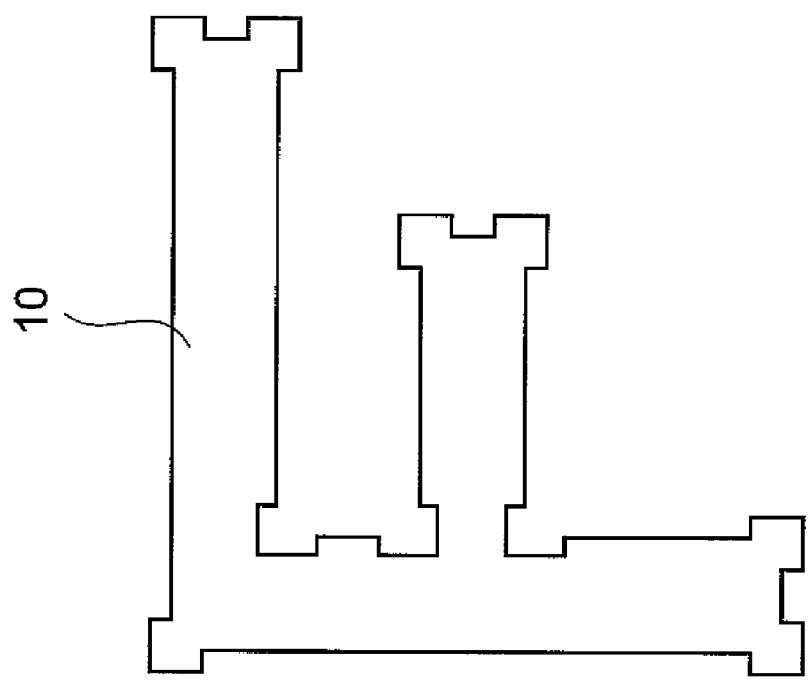
FIG. 23B is a diagram describing processing contents of Step S5 in the fourth embodiment of the present invention.
Figure 23A:
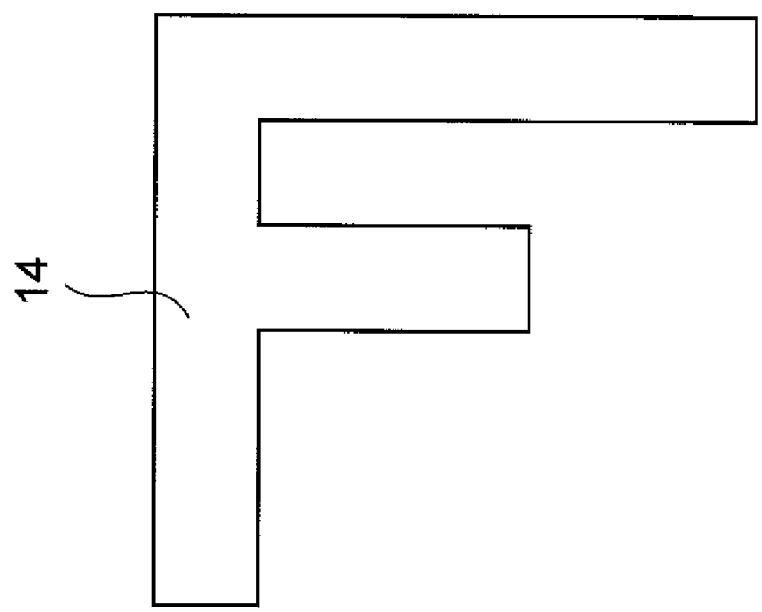
FIG. 23A is a diagram describing processing contents of Step S3 in the fourth embodiment of the present invention.

For example, the mask pattern 10 belonging to the UNIT-F is a horizontal figure, as described above. Accordingly, in Step S2, it is determined that the mask pattern 10 should be rotated in a direction that the tool A is good at processing. Then, the mask pattern 10 is rotated by 90° in Step S3, and thus becomes a rotated pattern 14 as shown in FIG. 23A. After that, OPC is performed thereon in Step S4, and thereafter, the rotated pattern 14 is reversely rotated by 90° in Step S5, and thus the mask pattern 10 as shown in FIG. 23B is obtained.

Figure 24:
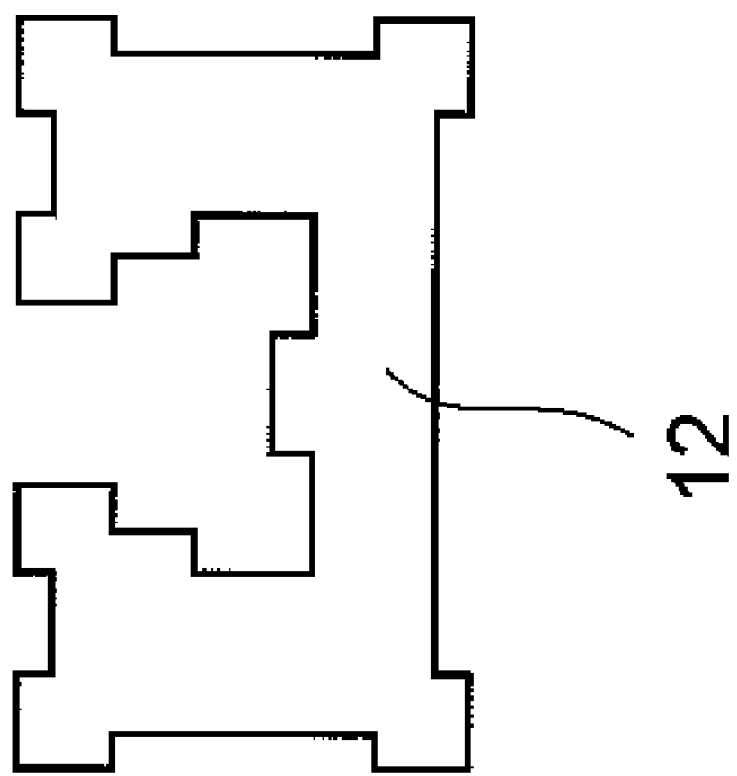
FIG. 24 is a diagram describing processing contents of Step S9 in the fourth embodiment of the present invention.

On the other hand, in the mask pattern 12 belonging to the UNIT-U (see FIG. 22), a total sum of lengths of respective vertical sides and a total sum of lengths of respective horizontal sides are respectively 10 and 8. Therefore, the mask pattern 12 is a vertical figure that the tool A is good at processing. Accordingly, in Step S2, it is determined that the mask pattern 12 should not be rotated and OPC is performed thereon in Step S16 as it is to be, so that the state shown in FIG. 24 is obtained.

Figure 25:
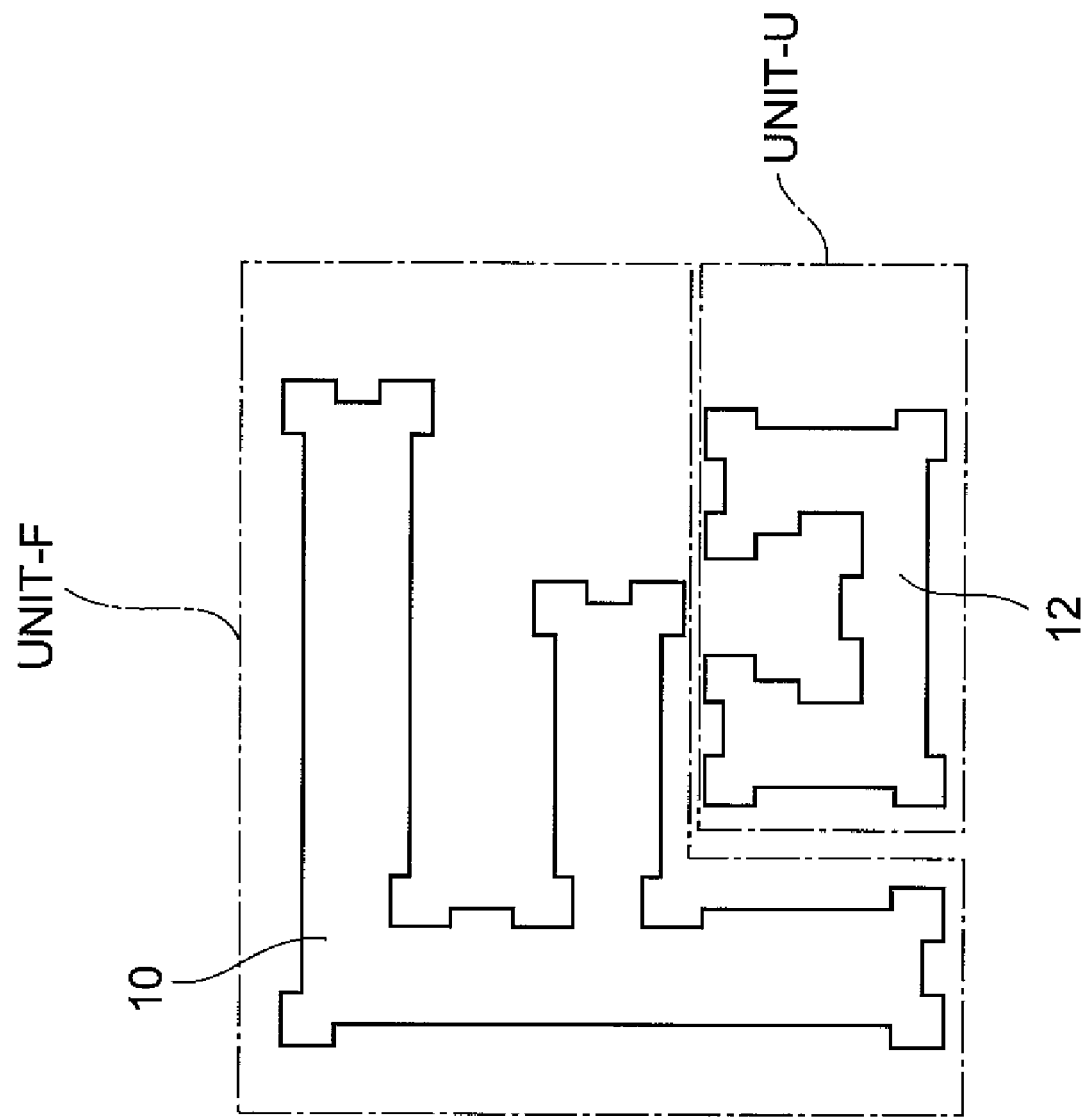
FIG. 25 is a diagram describing processing contents of Step S15 in the fourth embodiment of the present invention.

After the processes completed through Step S5 on each of UNIT-F and UNIT U, the process proceeds to Step S15, in which the UNIT-F and UNIT-U are combined together, so that the state shown in FIG. 25 is obtained.

With this, the main Steps of the present embodiment have been completed.

In the above-described present embodiment, the mask patterns 10 and 12 are divided into a plurality of units (UNIT-F and UNIT-U), rotation process is performed only on the mask pattern 10 that the tool A is not good at processing, and the rotation process is not performed on the mask pattern 12. Accordingly, the design data $D_1$ of the mask patterns 10 and 12 can be efficiently processed.

Note that two mask patterns 10 and 12 are very close to each other in some cases. In this case, if the only one of the patterns is rotated and OPC is performed on the two patterns, the patterns 10 and 12 would overlap each other when the rotated pattern is reversely rotated to bring it into the original state, so that the OPC cannot be properly performed on the patterns. In such a case, it is preferable that the both of the patterns are collectively rotated and applied with OPC, instead of separately rotating the patterns as in the above.

Effects of Time Reduction

Next, how much the processing time is reduced in the case where design data is processed according to the present embodiment is described below.

Figure 26:
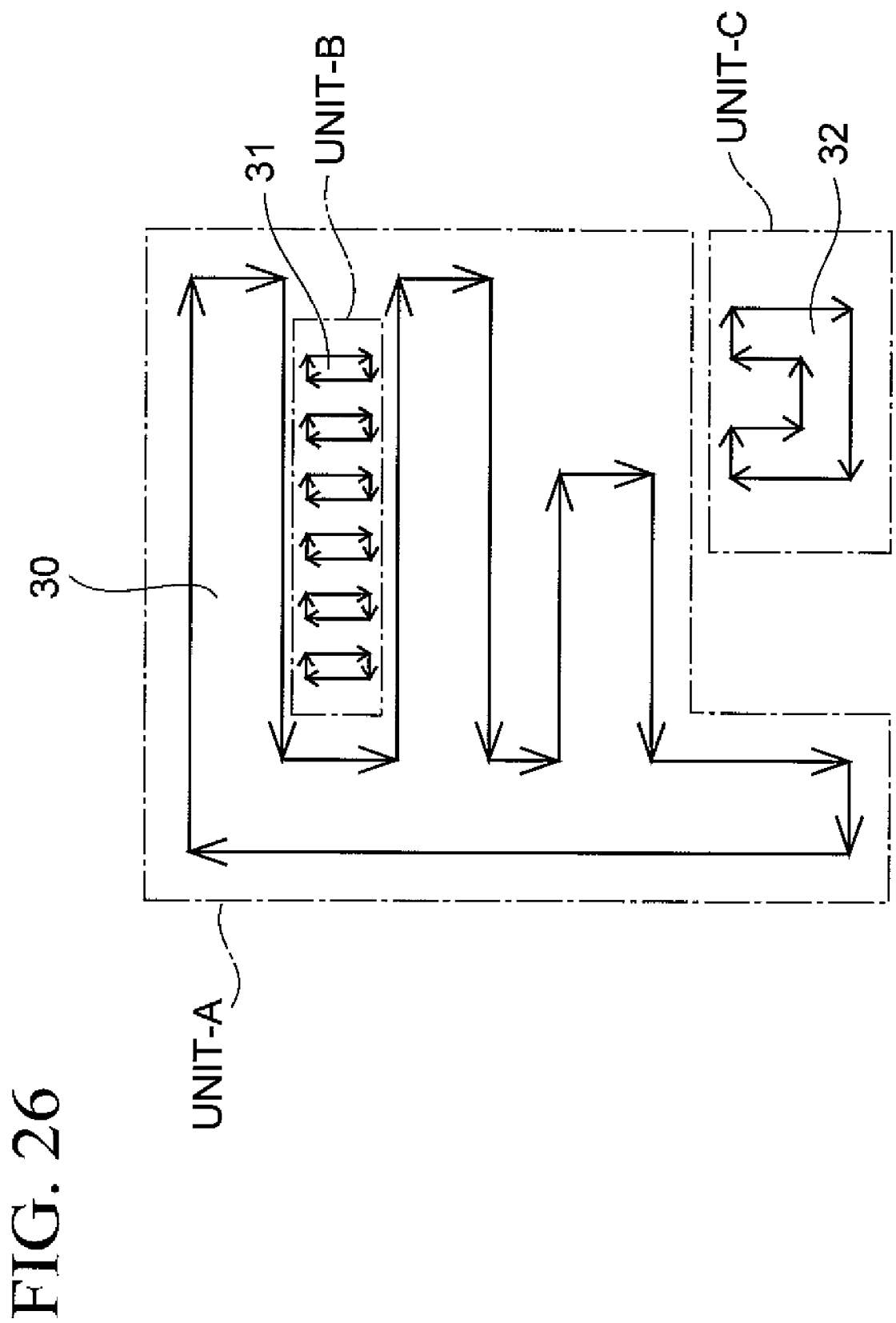
FIG. 26 is a plan view of a mask pattern used to estimate effects of reducing time in the fourth embodiment of the present invention.

It is assumed in the following that mask patterns 30 to 32 shown in FIG. 26 are respectively divided into UNIT-A to UNIT-C.

Table 1 below shows a total sum of lengths of respective vertical sides and a total sum of lengths of respective horizontal sides obtained for each unit.

TABLE 1

|        | Total Sum of Lengths Of Vertical Sides | Total Sum of Lengths Of Horizontal Sides |
|--------|----------------------------------------|------------------------------------------|
| UNIT-A | 54                                     | 88                                       |
| UNIT-B | 24                                     | 12                                       |
| UNIT-C | 12                                     | 10                                       |
| TOTAL  | 90                                     | 110                                      |

As shown in Table 1, the UNIT-A is a horizontal figure, and the UNIT-B and UNIT-C are vertical figures.

Here, it is assumed that processing time by a tool to be used, for example, the tool B, is shorter for a horizontal figure. In this case, the UNIT-B and UNIT-C, which are vertical figures, are to be rotated because the tool is not good at processing them. Table 2 below shows a total sum of lengths of respective vertical length and a total sum of lengths of respective horizontal sides, obtained for each unit after rotating them as described above.

TABLE 2

|        | Total Sum of Lengths Of Vertical Sides | Total Sum of Lengths Of Horizontal Sides |
|--------|----------------------------------------|------------------------------------------|
| UNIT-A | 54                                     | 88                                       |
| UNIT-B | 12                                     | 24                                       |
| UNIT-C | 10                                     | 12                                       |
| TOTAL  | 76                                     | 124                                      |

As shown in the bottom row of Table 2, a total of the lengths of the respective vertical sides of the respective units becomes "76", which the tool B is not good at processing, by decreasing by 14, and a total of the lengths of the horizontal respective sides of the respective units becomes 124, which the tool B is good at processing, by increasing by 14. That is, the length of the horizontal sides that the tool B is good at processing is increased approximately 1.18 times (=90/76) and the length of the vertical sides that the tool B is not good at processing is increased approximately 0.887 time (=110/124).

Accordingly, when it is assumed that it takes 100 hours for the processing in the case where rotation processing is not performed, it is estimated that the processing can be completed in approximately 88.7 (=0.887×100) hours even when only the reduced amount of the vertical sides is taken into account.

It is to be noted that, in the above description, the rotation process is applied to both of the UNIT-B and UNIT-C. However, it is also possible to perform the rotation process only on the UNIT-B.

Table 3 below shows a total sum of lengths of respective vertical sides and a total sum of lengths of respective horizontal sides obtained for each of the units in the case where only the UNIT-B is rotated.

TABLE 3

|        | Total Sum of Lengths Of Vertical Sides | Total Sum of Lengths Of Horizontal Sides |
|--------|----------------------------------------|------------------------------------------|
| UNIT-A | 54                                     | 88                                       |
| UNIT-B | 12                                     | 24                                       |
| UNIT-C | 12                                     | 10                                       |
| TOTAL  | 78                                     | 122                                      |

As shown in the bottom row in Table 3, by rotating only the UNIT-C, a large difference in a total of the lengths of the sides of the respective units does not occur between before the rotation and thereafter. This is because there is not a large difference between the total of the lengths of the respective vertical sides and the total of the lengths of the respective horizontal sides in the UNIT-C.

From the result of Table 3, it is understood that, in order to efficiently reduce the processing time, it is effective to perform rotation process on a unit having a large difference between the total length of vertical sides and the total length of horizontal sides.

(5) Fifth Embodiment

In the above-described first to fourth embodiments, OPC is performed on the design data on the mask patterns, but it is also possible that fracturing process is performed instead of OPC.

In this case, in the system 100 shown in FIG. 2, the correction tables 110 for OPC are unnecessary, and data conversion software for fracturing is used as tools A to C.

Figure 27:
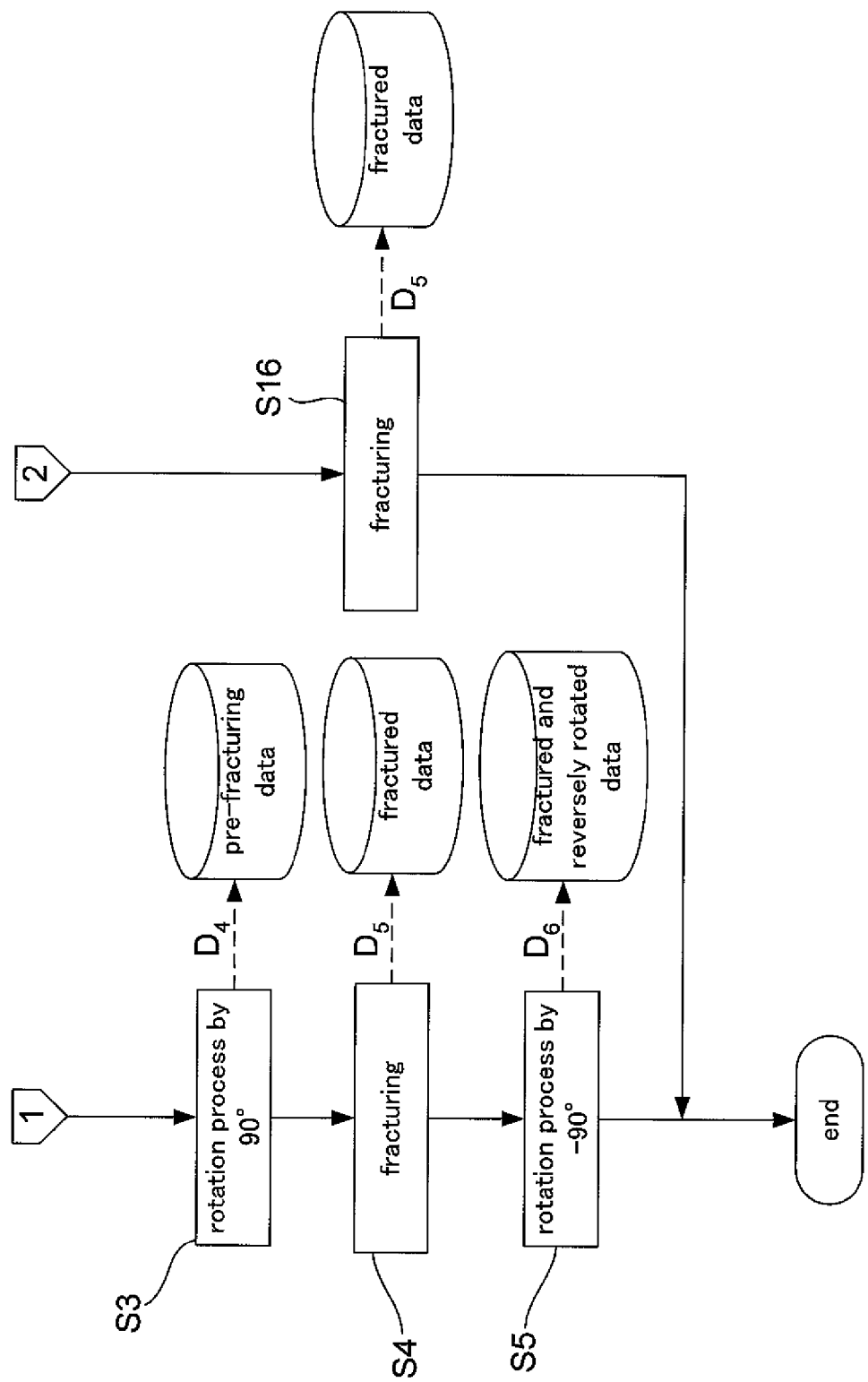
FIG. 27 is a flowchart for describing a pattern data processing method according to a fifth embodiment of the present invention.

FIG. 27 is a flowchart for describing a pattern data processing method according to the present embodiment. It is to be noted that Steps S0 to S2 before Step S3 are the same as those in FIG. 5 of the first embodiment, so that its explanation is omitted in the following.

As shown in FIG. 27, a difference between the present embodiment and the first embodiment (see, FIG. 6) is that fracturing is performed in Steps S4 and S16 instead of OPC.

Fracturing is a process which converts a format of pattern data into a format of data for an electron beam exposure system used for drawing a mask pattern on an exposure mask.

In the present embodiment, as the pattern data, the design data on the mask pattern before or after the OPC is performed is employed. Then, similar to the first embodiment, the process in Steps S1 to S5 and S16 are performed on the pattern data.

The format of the data includes GDS, OASIS, MEBES, JEOL52, HL-700, HL-800, HL-7000, VSB11, and BEF (Advantest). Among these, data on two different formats respectively become input data and output data in the fracturing.

Then, as a result of the processes in Steps S3 to S5, and S16, the data $D_4$ to $D_6$ are stored in the storage unit 105, respectively as pre-fracturing data, fractured data, and fractured and reversely rotated data.

Even in such a fracturing process, in Step S3, by rotating the mask data by 90° in a direction that tools A to C for fracturing are good at processing, it is possible to reduce time required for fracturing in Step S4 and time required for designing an exposure mask is reduced.

The preferred embodiments of the present invention have been described in detail as above, but the present invention is not limited to the above-described embodiments.

For example, in the first to fifth embodiments, a case where vertical and horizontal figures are used has been described. However, it is possible to perform the processes on an inclined figure by rotating it in a direction that a tool for OPC or fracturing is good at processing. For example, in the case of processing a figure inclined clockwise by 45° by a tool which is good at processing a horizontal figure, it is possible that the inclined figure is rotated clockwise by 45°, and thereafter the inclined figure is rotated counterclockwise by 45° to return it into its original direction after the processes.

As described above, according to the embodiment, since pattern data on a mask pattern is processed by rotating the mask pattern in a direction that the processing software is good at processing, the processing time can be more reduced than the conventional method.

What is claimed is:

1. A pattern data processing system comprising:
a storage unit for storing processing software; and
an operation unit executable by a processor, wherein
the operation unit obtains pattern data on a mask pattern,
the operation unit determines whether a processing time for the mask pattern in the processing software is reduced by rotating the mask pattern by a predetermined angle than a case where the mask pattern is processed in the processing software without being rotated, if the processing time is determined to be reduced, then the operation unit generates pattern data on a rotated pattern formed by rotating the mask pattern at the predetermined angle,
the operation unit processes the pattern data on the rotated pattern by using the processing software, and the operation unit causes the mask pattern to return to its original direction by reversely rotating the rotated pattern by the predetermined angle after processing the pattern data by using the processing software.

2. The pattern data processing system according to claim 1, wherein
the storage unit stores information on which is shorter in the following two processing times:
a processing time needed in the processing software for processing the mask pattern in which a total sum of lengths of vertical sides is larger than a total sum of lengths of the horizontal sides, and
a processing time needed in the processing software for processing the mask pattern in which a total sum of horizontal sides is larger than a total sum of the vertical sides; and
based on the pattern data, the operation unit makes decision on which value to be larger, the total sum of the lengths of the vertical sides of the mask pattern, or the total sum of the lengths of the horizontal sides of the mask pattern, and the operation unit determines whether the processing time is reduced, based on the decision result and the information.

3. The pattern data processing system according to claim 2, wherein the operation unit makes the decision on which value to be larger, the total sum of the lengths of the vertical sides of the mask pattern, or the total sum of the lengths of the horizontal sides of the mask pattern, by performing the steps of:
in a case where the mask pattern is formed of a group of a plurality of figures, obtaining a sum of lengths of the respective vertical sides and a sum of lengths of the respective horizontal sides of each of the plurality of figures;
obtaining a total length of vertical sides by adding the sums of the lengths of the vertical sides of all of the figures together, and obtaining a total length of horizontal sides by adding the sums of the lengths of the horizontal sides of all of the figures together; and obtaining the total sum of the vertical sides by subtracting lengths of vertical sides shared by the plurality of figures from the total length of the vertical sides, and obtaining the total sum of the horizontal sides by subtracting lengths of horizontal sides shared by the plurality of figures from the total length of the horizontal sides.

4. The pattern data processing system according to claim 2, wherein the operation unit makes the decision on which value to be larger, the total sum of the lengths of the vertical sides of the mask pattern, or the total sum of the lengths of the horizontal sides of the mask pattern, by performing the steps of:

in a case where the mask pattern is formed of a group of a plurality of figures, uniting the plurality of figures, and obtaining the total sum of the lengths of the vertical sides of the united mask pattern, and the total sum of the lengths of the horizontal sides of the united mask pattern.

5. The pattern data processing system according to claim 1, wherein the operation unit performs the steps of:

before deciding whether the processing time is reduced, dividing the mask pattern into a plurality of units;

for each of the units independently, executing the step of obtaining pattern data on the rotated pattern, the step of carrying out processing by using the processing software, and the step of causing the mask pattern to return to its original direction; and after the step of causing the mask pattern to return to its original direction, combining the plurality of units.

6. The pattern data processing system according to claim 1, wherein the pattern data is design data on the mask pattern, and
the processing software is software for performing optical proximity correction on the mask pattern.

7. The pattern data processing system according to claim 1, wherein the processing software is software for converting a format of the pattern data.

8. The pattern data processing system according to claim 7, wherein the format conversion is a conversion of the format of the pattern data into a format of data, which is used in an electron beam exposure apparatus used when a mask pattern is written on an exposure mask.

9. A pattern data processing method comprising:
(S1) obtaining pattern data on a mask pattern;
(S2) determining whether a processing time for the mask pattern in a processing software is reduced by rotating the mask pattern by a predetermined angle than a case where the mask pattern is processed in the processing software without being rotated;
(S3) obtaining pattern data on a rotated pattern formed by rotating the mask pattern by the predetermined angle in the case that the processing time is reduced;
(S4) processing the pattern data on the rotated pattern by using the processing software; and
(S5) causing the mask pattern to return to its original direction.

10. The pattern data processing method according to claim 9, wherein the determining comprising:
(S6) making decision on which value to be larger, a total sum of lengths of vertical sides of the mask pattern, or a total sum of lengths of horizontal sides of the mask pattern, based on the pattern data;
(S7) referring to information on which is shorter in the following two processing times:
a processing time needed in the processing software for processing the mask pattern in which the total sum of the lengths of the vertical sides is larger than the total sum of the lengths of the horizontal sides, and a processing time needed in the processing software for processing the mask pattern in which the total sum of the horizontal sides is larger than the total sum of the vertical sides;
(S8) determining whether the processing time is more reduced by rotating the mask pattern by the predetermined angle based on the decision and the information.

11. The pattern data processing method according to claim 10, wherein the making decision comprising:
(S9) in a case where the mask pattern is formed of a group of a plurality of figures, obtaining a sum of lengths of the respective vertical sides and a sum of lengths of the respective horizontal sides of each of the plurality of figures;
(S10) obtaining a total length of vertical sides by adding the sums of the lengths of the vertical sides of all of the figures together, and obtaining a total length of horizontal sides by adding the sums of the lengths of the horizontal sides of all of the figures together;
(S11) obtaining the total sum of the vertical sides by subtracting lengths of vertical sides shared by the plurality of figures from the total length of the vertical sides, and obtaining the total sum of the horizontal sides by subtracting lengths of horizontal sides shared by the plurality of figures from the total length of the horizontal sides.

12. The pattern data processing method according to claim 10, wherein the making decision comprising:
(S12) in a case where the mask pattern is formed of a group of a plurality of figures, uniting the plurality of figures, and
(S13) obtaining the total sum of the lengths of the vertical sides of the united mask pattern, and the total sum of the lengths of the horizontal sides of the united mask pattern.

13. The pattern data processing method according to claim 9, further comprising:
(S14) dividing the mask pattern into a plurality of units before the determining; and
(S15) combining the plurality of units after the causing, wherein
the determining, the obtaining, the processing, and the causing the mask pattern are performed independently for each of the plurality of units.

14. The pattern data processing method according to claim 9, wherein
the pattern data are design data on the mask pattern, and
the processing software is software for performing optical proximity correction on the mask pattern.

15. The pattern data processing method according to claim 9, wherein the processing software is software for converting a format of the pattern data.

16. A pattern data processing program stored on a non-transitory computer-readable storage medium and executed in a computer, the method comprising steps of:
(S1) obtaining pattern data on a mask pattern;
(S2) determining whether a processing time for the mask pattern in a processing software is more reduced by rotating the mask pattern by a predetermined angle than a case where the mask pattern is processed in the processing software without being rotated;
(S3) if it is determined in the determining that the processing time is reduced, obtaining pattern data on a rotated pattern formed by rotating the mask pattern at the predetermined angle;
(S4) processing the pattern data on the rotated pattern by using the processing software; and (S5) causing the mask pattern to return to its original direction.

17. The pattern data processing program according to claim 16, wherein the determining comprising:
- (S6) making decision on which value to be larger, a total sum of lengths of vertical sides of the mask pattern, or a total sum of lengths of horizontal sides of the mask pattern, based on the pattern data;
- (S7) referring to information on which is shorter in the following two processing times:
- a processing time needed in the processing software for processing the mask pattern in which the total sum of the lengths of the vertical sides is larger than the total sum of the lengths of the horizontal sides, and
- a processing time needed in the processing software for processing the mask pattern in which the total sum of the horizontal sides is larger than the total sum of the vertical sides;
- (S8) determining whether the processing time is more reduced by rotating the mask pattern by the predetermined angle based on the decision of the making decision and the information.

18. The pattern data processing program according to claim 17, wherein the making decision comprising:
- (S9) in a case where the mask pattern is formed of a group of a plurality of figures, obtaining a sum of lengths of the respective vertical sides and a sum of lengths of the respective horizontal sides of each of the plurality of figures;
- (S10) obtaining a total length of vertical sides by adding the sums of the lengths of the vertical sides of all of the figures together, and obtaining a total length of horizontal sides by adding the sums of the lengths of the horizontal sides of all of the figures together;
- (S11) obtaining the total sum of the vertical sides by subtracting lengths of vertical sides shared by the plurality of figures from the total length of the vertical sides, and obtaining the total sum of the horizontal sides by subtracting lengths of horizontal sides shared by the plurality of figures from the total length of the horizontal sides.

19. The pattern data processing program according to claim 17, wherein
- (S12) in a case where the mask pattern is formed of a group of a plurality of figures, uniting the plurality of figures, and
- (S13) obtaining the total sum of the lengths of the vertical sides of the united mask pattern, and the total sum of the lengths of the horizontal sides of the united mask pattern.

20. The pattern data processing program according to claim 16, further causing the computer to execute the steps of:
- (S14) dividing the mask pattern into a plurality of units before the determining; and
- (S15) combining the plurality of units after the causing the mask pattern, wherein
- the determining, the obtaining, the processing and the causing are performed independently for each of the plurality of units.

* * * * *